United States Patent [19]
Barrett, Jr. et al.

[11] Patent Number: 5,754,598
[45] Date of Patent: May 19, 1998

[54] METHOD AND APPARATUS FOR CONTROLLING A PHASE LOCK LOOP

[75] Inventors: Raymond Louis Barrett, Jr., Ft. Lauderdale; Barry W. Herold, Boca Raton; Grazyna Anna Pajunen, Delray Beach, all of Fla.

[73] Assignee: Motorola, Inc., Schaumburg, Ill.

[21] Appl. No.: 652,054

[22] Filed: May 23, 1996

[51] Int. Cl.⁶ .................. H03D 3/18; H03D 3/24
[52] U.S. Cl. .................. 375/327; 375/376; 331/1 R; 331/11; 331/14; 331/17; 327/159
[58] Field of Search .................. 375/327, 376; 331/1 R, 11, 14, 17, 34, 1 A; 327/147, 148, 150, 156, 157, 159

[56] References Cited

U.S. PATENT DOCUMENTS 4,167,711  9/1979  Smoot.
5,463,351  10/1995  Marko et al. .................. 375/376
5,485,484  1/1996  Williams et al. .................. 375/376
5,487,093  1/1996  Adresen et al. .................. 375/376
5,511,100  4/1996  Lundberg et al. .................. 375/376
5,576,664  11/1996  Herold et al. .................. 375/376

OTHER PUBLICATIONS

Graham C. Goodwin & Kwai Sang Sin, "Adaptive Filtering Prediction & Control", pp. 118–171, 1984, USA.
Carver Mead, "Analog VLSI & Neural Systems", pp. 67–82, 1989, USA.

*Primary Examiner*—Don N. Vo
*Attorney, Agent, or Firm*—R. Louis Breeden

[57] ABSTRACT

A phase lock loop of a synthesizer (143) is controlled by applying (506) modern optimal control techniques for a predetermined period in a computing engine (222), in response to an error being introduced into a signal of the phase lock loop, and by utilizing (510) classical control techniques for controlling the phase lock loop after the predetermined period.

15 Claims, 15 Drawing Sheets

*100*

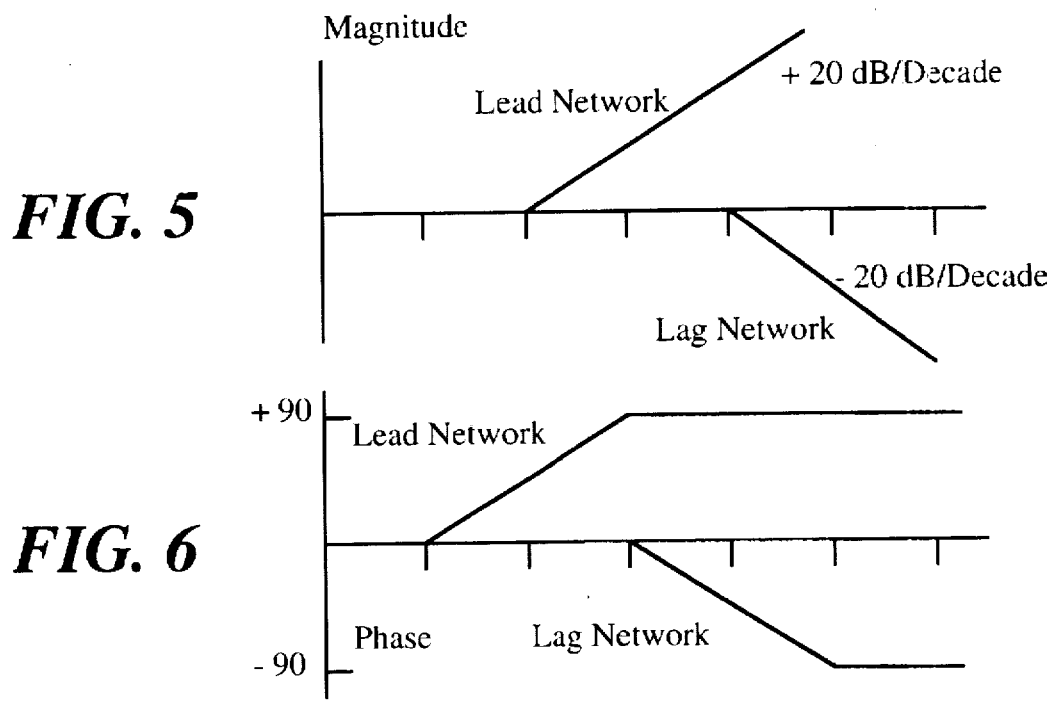
FIG. 5
FIG. 6
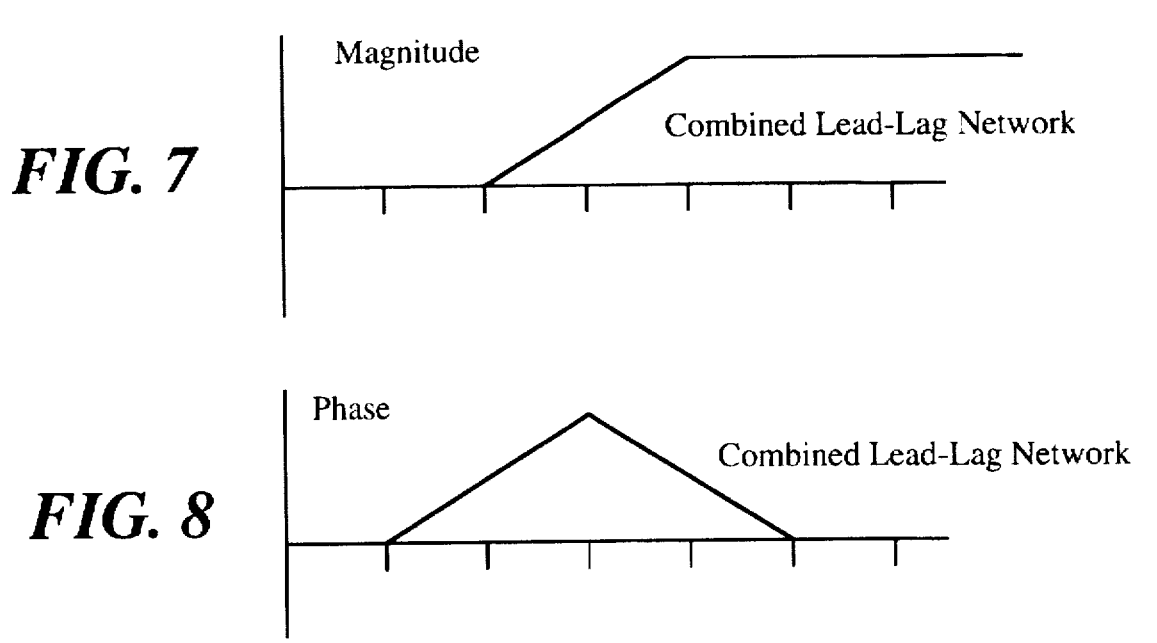
FIG. 7
FIG. 8

308, 310

METHOD AND APPARATUS FOR CONTROLLING A PHASE LOCK LOOP

RELATED PATENT

U.S. Pat. No. 5,651,037 issued Jul. 22, 1997 by Barrett et al., entitled "Apparatus for Performing Discrete Time Analog Queuing and Computing in a Communication System."

1. Field of the Invention

This invention relates in general to phase lock loops, and more specifically to a method and apparatus for controlling a phase lock loop.

2. Background of the Invention

Classical frequency synthesizers employing phase lock loops which can be programmed to two or more frequencies that are integer multiples of a reference frequency inherently have long lock times during the reprogramming process. The same is true during initial power-up of the frequency synthesizer. The lock time for a programmable frequency synthesizer is considered the time taken by the frequency synthesizer to switch from one operating frequency to a second operating frequency within a desired frequency lock range (e.g., ±10 Hz from the desired second operating frequency), or the time period needed to achieve a desired power-up frequency within a desired frequency lock range.

The long lock time arises from the use of classical controllers in the phase lock loop, which necessarily employ a limited gain-bandwidth to avoid loop instability. Such controllers can typically require, for example, 50 cycles of the reference frequency to achieve lock after power up or frequency reprogramming.

Battery powered devices, such as portable selective call receivers, employ signals generated by frequency synthesizers for various applications, such as decoding of selective call signals and down conversion of received radio frequencies. For maximum battery life it is important for the synthesizers to have a short lock time, so that the generated signals are stable and usable shortly after power up or after the synthesizer frequency is reprogrammed.

Thus, what is needed is a method and apparatus for controlling a phase lock loop in a fast and efficient manner. Preferably the method and apparatus will control the phase lock loop such that a significant reduction in the lock time is achieved.

SUMMARY OF THE INVENTION

An aspect of the present invention is a method for controlling a phase lock loop. The method comprises the steps of applying modern optimal control techniques to control the phase lock loop for a predetermined period, in response to an error being introduced into a signal of the phase lock loop; and utilizing classical control techniques for controlling the phase lock loop after the predetermined period.

Another aspect of the present invention is an apparatus for controlling a phase lock loop. The apparatus comprises a first element for applying modern optimal control techniques to control the phase lock loop for a predetermined period, in response to an error being introduced into a signal of the phase lock loop; and a second element, coupled to the first element, for utilizing classical control techniques for controlling the phase lock loop after the predetermined period.

Another aspect of the present invention is a phase lock loop comprising an integrator coupled to a computing element for integrating a control signal from the computing element, and a controlled oscillator coupled to the integrator for generating a controlled signal. The phase lock loop further comprises a frequency divider coupled to the controlled oscillator for dividing the frequency of the controlled signal to produce a divided signal, and a phase error detector coupled to the divided signal and coupled to a reference signal for producing a phase error signal by comparing the reference signal and the divided signal. The phase lock loop also includes the computing element coupled to the phase error detector for producing the control signal from the phase error signal.

The computing element is arranged to apply modern optimal control techniques to control the phase lock loop for a predetermined period, in response to an error being introduced between the divided signal and the reference signal; and to utilize classical control techniques for controlling the phase lock loop after the predetermined period.

BRIEF DESCRIPTION OF THE DRAWINGS

FIG. 5 is a magnitude diagram of a lead-lag network.

FIG. 6 is a phase diagram of the lead-lag network.

FIG. 7 is a resultant magnitude diagram of the lead-lag network.

FIG. 8 is a resultant phase diagram of the lead-lag network.

DESCRIPTION OF THE PREFERRED EMBODIMENT

Figure 1:
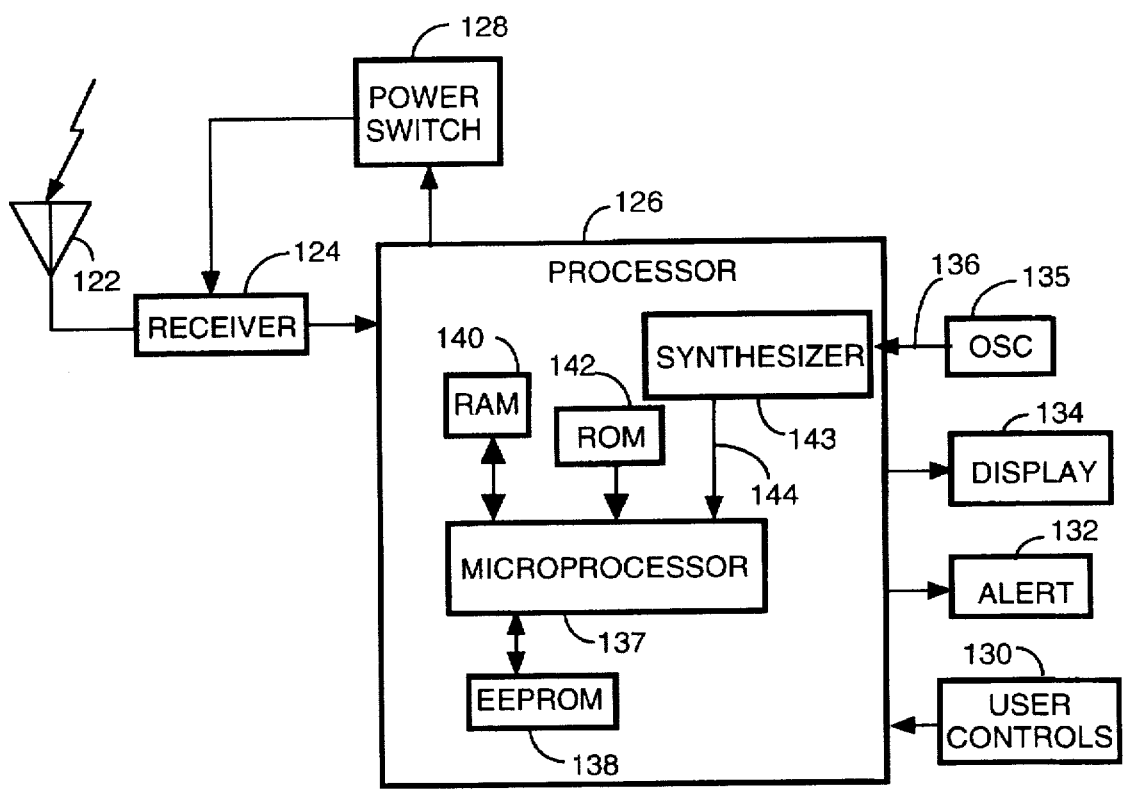
FIG. 1 is an electrical block diagram of a communication receiver in accordance with the present invention.

FIG. 1 is an electrical block diagram of a communication receiver 100 in accordance with the preferred embodiment of the present invention. The communication receiver 100 includes a receiver antenna 122 for intercepting radio frequency (RF) signals comprising messages from a transmitting station (not shown). The receiver antenna 122 is coupled to a receiver 124 applying conventional demodulation techniques for receiving the RF signals. Once the RF signals have been demodulated, the receiver 124 generates demodulated message information which is presented to a processor 126 for processing.

A conventional power switch 128, coupled to the processor 126, is used to control the supply of power to the receiver 124, thereby providing a battery saving function.

To perform the necessary functions of the communication receiver 100, the processor 126 includes a microprocessor 137, a random access memory (RAM) 140, a read-only memory (ROM) 142, an electrically erasable programmable read-only memory (EEPROM) 138, and a frequency synthesizer 143 in accordance with the present invention.

Preferably, the microprocessor 137 is similar to the M68HC08 micro-controller manufactured by Motorola, Inc. It will be appreciated that other similar processors can be utilized for the microprocessor 137, and that additional processors of the same or alternative type can be added as required to handle the processing requirements of the processor 126. It will also be appreciated that other types of memory, e.g., EEPROM or FLASH, can be utilized for the ROM 142, as well as the RAM 140. It will be further appreciated that the RAM 140 and the ROM 142, singly or in combination, can be integrated as an integral portion of the processor 126.

The processor 126 is programmed by way of the ROM 142 to process incoming messages transmitted by the transmitting station. During message processing, the processor 126 decodes in a conventional manner an address in the demodulated message information, compares the decoded address with one or more addresses stored in the EEPROM 138, and when a match is detected, proceeds to process the remaining portion of the message.

Once the processor 126 has processed the message, it stores the message in the RAM 140, and a call alerting signal is generated to alert a user that a message has been received. The call alerting signal is directed to a conventional audible or tactile alerting device 132 for generating an audible or tactile call alerting signal.

The message can be accessed by the user through user controls 130, which provide functions such as lock, unlock, delete, read, etc. More specifically, by the use of appropriate functions provided by the user controls 130, the message is recovered from the RAM 140, and then conveyed to the user by way of an information interface comprising a display 134 for displaying the message, e.g., a conventional liquid crystal display (LCD).

The microprocessor 137 is also coupled to the frequency synthesizer 143 providing the function of a phase-locked loop (PLL) preferably utilized for clock generation to the core circuitry of the microprocessor 137. The frequency synthesizer 143 is also coupled to a time base reference oscillator 135 for generating a reference signal 136.

Figure 2:
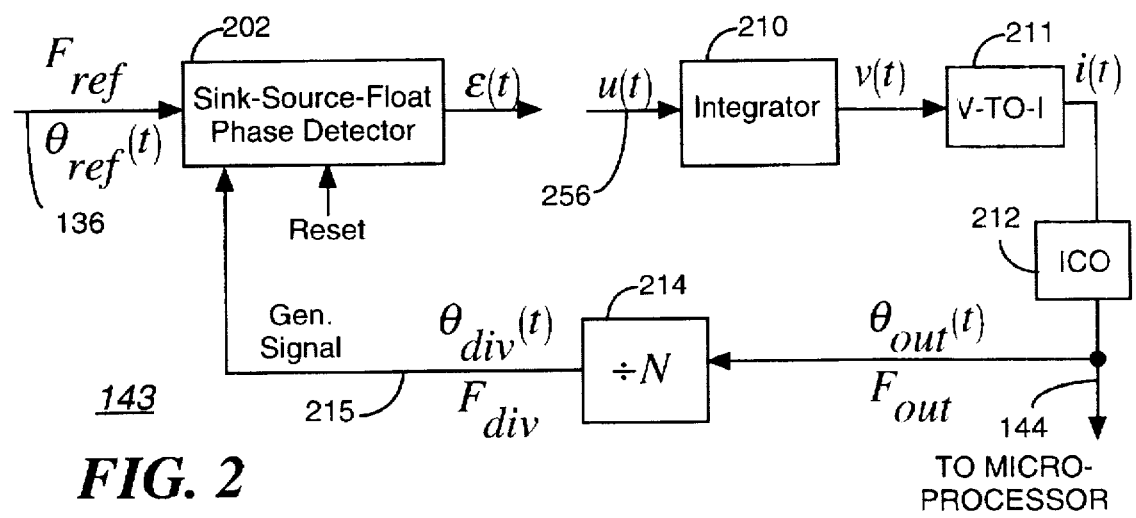
FIG. 2 is an open loop electrical block diagram of a synthesizer in accordance with the present invention.

FIG. 2 is an open loop electrical block diagram of the frequency synthesizer 143 of FIG. 1. The open loop block diagram includes a conventional sink-source-float (SSF) phase detector 202, a conventional integrator 210, a conventional voltage-to-current (V-TO-I) converter 211, a conventional current-controlled oscillator (ICO) 212, and a conventional divide by N frequency divider 214.

The sink-source-float phase detector 202 is coupled to the reference signal 136 with frequency $F_{ref}$ (or equivalent phase $\theta_{ref}(t)$) generated by the time base reference oscillator 135, and is coupled to a generated signal 215 derived from the divide by N frequency divider 214. Once the sink-source-float phase detector 202 has calculated the phase difference between the reference signal 136 and the generate signal 215 a phase error signal $\epsilon(t)$ is created.

The integrator 210 receives the phase error signal $\epsilon(t)$ processed in the form of a signal u(t) (to be derived below). The integrator generates a control signal v(t) which is converted to a current by the V-TO-I converter 211. The current signal i(t) generated by the V-TO-I converter 211 is coupled to the input of the ICO 212.

The ICO 212 in response to the current signal i(t) generates a desired signal at a desired frequency $F_{out}$ (or equivalent phase $\theta_{out}(t)$) which is coupled to the divide by N frequency divider 214.

The divide by N frequency divider 214 divides the frequency $F_{out}$ by a factor of N thereby generating a divided frequency $F_{div}$ (or equivalent phase $\theta_{div}(t)$).

To determine the open loop transfer function G(s) of the circuit of FIG. 2 the transfer function of each block must be determined. As is well known by one of ordinary skill in the art, the sink-source-float phase detector 202 can be modeled by the transfer function $$\epsilon(s) = K_p \cdot \theta(s) \cdot e^{-(s \cdot T)}$$

where $K_p$ is a constant determined by the gain of the phase detector 202, $$T = \frac{1}{F_{ref}}, \text{ and } \theta(s) = \theta_{ref}(s) - \theta_{div}(s).$$

Similarly the transfer function of the integrator can be expressed as $$V(s) = \frac{1}{s} \cdot U(s).$$

The transfer function of the V-TO-I converter 211 in combination with the ICO 212 can be expressed as $$\theta_{out}(s) = \frac{K_v}{s} \cdot V(s),$$

where $K_v$ is a constant. Finally, the transfer function of the divide by N frequency divider 214 can be expressed as $$\theta_{div}(s) = \frac{1}{N} \cdot \theta_{out}(s).$$

Including the above transfer functions in the expression $$\epsilon(s) = K_p \cdot (\theta_{ref}(s) - \theta_{div}(s)) \cdot e^{-(s \cdot T)}$$

gives the result $$\epsilon(s) = K_p \cdot e^{-(s \cdot T)} \cdot \theta_{ref}(s) - \frac{K_p \cdot K_v}{N} \cdot \frac{e^{-(s \cdot T)}}{s^2} \cdot U(s).$$

Arbitrarily letting $U(s)=H(s) \cdot \epsilon(s)$ gives the result $$\theta_{out}(s) = \frac{K_p \cdot K_v \cdot \frac{e^{-(s \cdot T)}}{s^2} \cdot H(s)}{\left[ 1 + \frac{K_p \cdot K_v}{N} \cdot \frac{e^{-(s \cdot T)}}{s^2} \cdot H(s) \right]} \cdot \theta_{ref}(s).$$

Letting $G(s)$ equal $$G(s) = \frac{K_p \cdot K_v}{N} \cdot \frac{e^{-(s \cdot T)}}{s^2}$$

then the above equation for $\theta_{out}(s)$ can be rewritten as $$\frac{\theta_{out}(s)}{\theta_{ref}(s)} = N \cdot \left[ \frac{G(s) \cdot H(s)}{1 + G(s) \cdot H(s)} \right].$$

Figure 3:
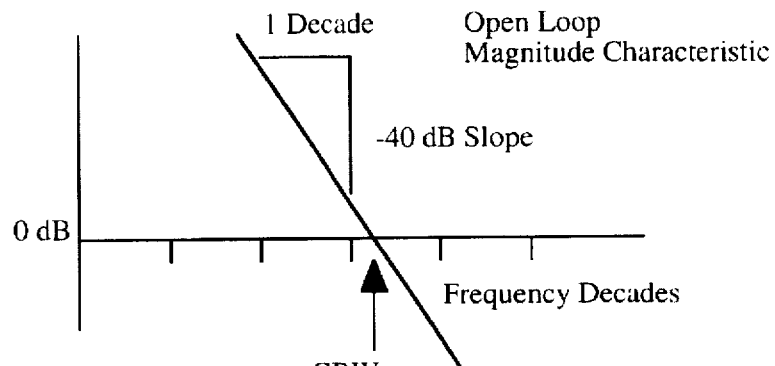
FIG. 3 is an open loop magnitude diagram of the synthesizer.

Letting $$K = \frac{K_p \cdot K_v}{N},$$

then G(s) can be thought of as a double integrator with a characteristic frequency defined by $K=\omega^2$, combined with a delay of T seconds, which provides a frequency dependent phase. Using a Bode Plot representation as shown in FIG. 3, the double integrator provides a magnitude slope of −40 dB per decade, with the Gain Band Width (GBW) of zero dB at $\omega=\sqrt{K}$, and a constant −180 degree phase characteristic, while the delay provides a constant 0 dB magnitude (unaffecting the double integrator magnitude characteristics), but providing constant frequency dependent phase slope adding from 0 degrees at DC to −360 degrees additional at $F_{Ref}$.

Figure 4:
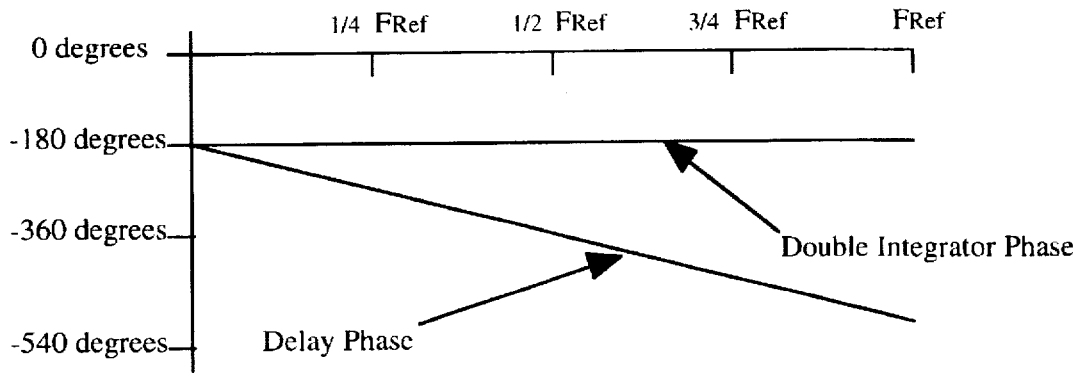
FIG. 4 is an open loop phase diagram of the synthesizer.

Note, that while the magnitude characteristic illustrated above in FIG. 3 is shown with the magnitudes in decibels (dB) and a logarithmic frequency axis, it is more natural to show the phase characteristic below in FIG. 4 with arithmetic phase values in degrees and an arithmetic frequency axis. The frequency scales are chosen differently to simplify the illustrations to straight lines in their respective representations.

With a double integrator alone, classical feedback theory shows that the phase margin is zero, while the SSF delay worsens the situation. An appropriate controller can be designed to eliminate this problem. A relatively simple controller design can be achieved by configuring H(s) to include a lead-lag compensation network, and this is the usual practice. Such a compensation network introduces a positive phase slope of 45 degrees per decade, beginning one decade below its zero frequency, and introduces a negative phase slope of 45 degrees per decade, beginning one decade below its pole frequency. FIGS. 5 and 6 show the lead-lag magnitude and phase characteristics, respectively.

The asymptotic behaviors of a zero are used to provide the lead behaviors, and the asymptotic behaviors of a pole are used to provide the lag behaviors. The zero is introduced at a lower frequency than the pole, providing up to 90 degrees of compensating asymptotic phase shift, before the introduction of the pole reduces the phase shift back to zero. The zero introduces asymptotic phase shift beginning at a frequency one decade below the zero's characteristic frequency and ending one decade above the zero's characteristic frequency. The phase slope of the zero is +45 degrees per decade and results in a maximum of +90 degrees asymptotic phase shift, while the pole, in turn removes all phase shift introduced by the zero, beginning at a frequency one decade below the pole's characteristic frequency.

It is immediately apparent that a phase contribution of a possible +90 degrees can do a great deal to stabilize the loop gain of the PLL, but there are limits. The limits deal primarily with the maximum frequency that can be chosen for the GBW of the closed loop, and hence affect the speed of response of the loop. For the sake of illustration, a lead-lag network is configured with the zero a full two decades below the pole, asymptotically providing the maximum phase compensation possible of +90 degrees. The asymptotic characteristics of such a network are shown in the following illustration, but the asymptotic values illustrated are not achievable in practice, and are shown here only for the purposes of developing a practicable classical design. FIGS. 7 and 8 show the resultant magnitude and phase diagrams of the combined lead-lag network.

An absolute maximum limit can be established for the GBW, if the frequency at which the phase margin can just be made zero is chosen, and hence no frequency above that can be compensated with any remaining phase margin. This maximum can be established simply from the observation that the phase margin is identically zero from the action of the double integrator alone, and further reduced by the straight line phase slope of the delay. A positive phase compensation of +90 degrees is just enough to compensate for the phase introduced by the delay when that phase decreases to −90 degrees. Since the phase slope is linear, and −360 degrees is introduced at $F_{Ref}$, −90 degrees is introduced at 25% of $F_{Ref}$. With the assumptions made above, there is no possible way a lead-lag network can achieve a GBW greater than 25% of $F_{Ref}$.

To design a practicable set of values for a lead-lag network, the pole is designed for a frequency that is 16 times the zero frequency (the pole is 4 octaves above the zero). Using a network with a single resistor and two capacitors, the frequency ratio is 1 plus the ratio of capacitance values, (a ratio of capacitor values of 15 was chosen which is a standard manufacturing ratio), and the actual peak phase compensation is about 62 degrees. The lead-lag zero compensation has its peak phase effect at the geometric mean of the pole and zero frequencies (2 octaves from each) and therefore, the frequency geometrically mid-way between the zero and the pole is the closed loop GBW, since that is the frequency at which the compensation is desired for best phase margin. The zero is located two octaves below the peak phase frequency, and the pole is located two octaves above it.

Further, to provide the best compromise between settling time and phase margin, the GBW must be designed to be approximately 7% of $F_{Ref}$. At 7% of $F_{Ref}$ the delay introduces 0.07 times -360 degrees, or about -25 degrees, reducing the phase compensation to 62-25=37 degrees of phase margin. Such phase margin in a closed loop response results in behavior that is clearly resonant at the GBW natural frequency, but typically settles to an acceptable frequency error in about 3 to 4 cycles of the natural frequency.

A closed loop GBW can be established at a slightly higher frequency, at the cost of phase margin, more pronounced resonance, and increased settling time. Again, a closed loop GBW can be established at a slightly lower frequency, gaining phase margin, with less pronounced resonance, but the lower natural frequency also results in increased settling time. Extensive simulation reveals the optimum GBW to be 0.07●$F_{Ref}$ with the lead-lag network designed for a pole frequency that is 16 times the zero frequency.

Figure 9:
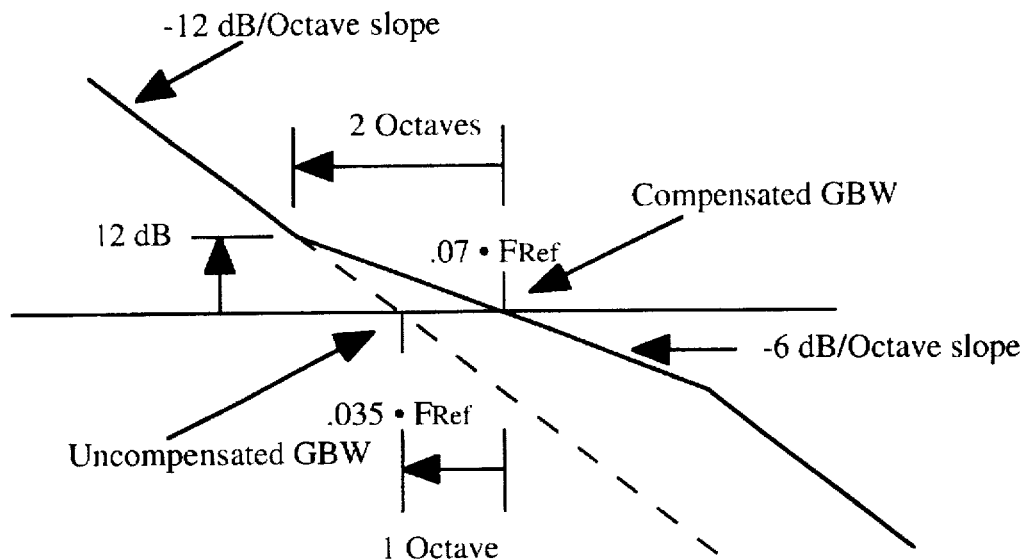
FIG. 9 is an illustration of compensated gain band width.

To achieve the results discussed above, the design procedure begins with the known achievable closed loop GBW. The design further proceeds in selection of the lead-lag pole and zero frequencies to the only possible open loop GBW that achieves the desired closed loop GBW. While a more widely separated pole-zero pair does slightly improve GBW, the particular choice of four octaves separation range for the lead-lag network simplifies the design procedure considerably, as can be seen from the following illustration in FIG. 9, and is used for the remainder of the discussion of performance of the classically controlled PLL.

With the closed loop GBW determined, the open-loop GBW is likewise determined by the asymptotic gain slope, i.e. the argument that the zero, two octaves below the closed loop GBW, is at +12 dB (-6 dB per octave gain slope for two octaves), while the open loop would decrease that +12 dB to 0 dB in one octave (-12 dB per octave gain slope for one octave), and hence the open loop, uncompensated GBW must be at the remaining one octave below the closed loop GBW.

Since the GBW is 0.07●$F_{Ref}$ the period associated with the GBW natural frequency is about 14.28 cycles of the reference, and settling is satisfactory in about 3 to 4 cycles of the natural frequency, which is 43 to 57 cycles of the reference frequency. Only very slightly better results are obtained if the pole and zero are further separated, but sampling noise considerations prevent very wide separations.

Implementation issues of PLL systems that use the sink-source-float phase detector include the response of the system to various internal and external sources of noise, the noise introduced by the sampling process, the settling time, the sensitivity of the design solution to variations in the components, and the effect of changes in loop gain with changes in the frequency divider.

As a first issue, to compensate G(s) the lead-lag transfer function is needed for one type of classical controller:

$$H(s) = \frac{\frac{s}{\omega_z}+1}{\frac{s}{\omega_x}+1} \text{, or } H(s) = \frac{\left(\frac{s}{0.0175\omega_{ref}}\right)+1}{\left(\frac{s}{0.28\omega_{ref}}\right)+1}.$$

A technique exists for discrete-time computation of control signals, therefore it becomes desirable to discretize the above continuous-time lead-lag filter function. This is done by utilizing the well-known bilinear transform employing the substitution:

$$s = C \cdot \frac{1-z^{-1}}{1+z^{-1}}$$

and employing the parameterization $k_z = 4/0.07 \, w_{ref}$ and $k_p = 0.25/0.07 \, w_{ref}$ so that $$H(z) = \frac{(1+k_zC)+(1-k_zC)z^{-1}}{(1+k_pC)+(1-k_pC)z^{-1}}.$$

Letting $C = m \cdot 0.07 \cdot w_{ref}$ leads to $k_z = 4m$, $k_p = 0.25m$, and $$H(z) = \frac{(1+4m)+(1-4m)z^{-1}}{(1+m/4)+(1-m/4)z^{-1}}.$$

Figure 10:
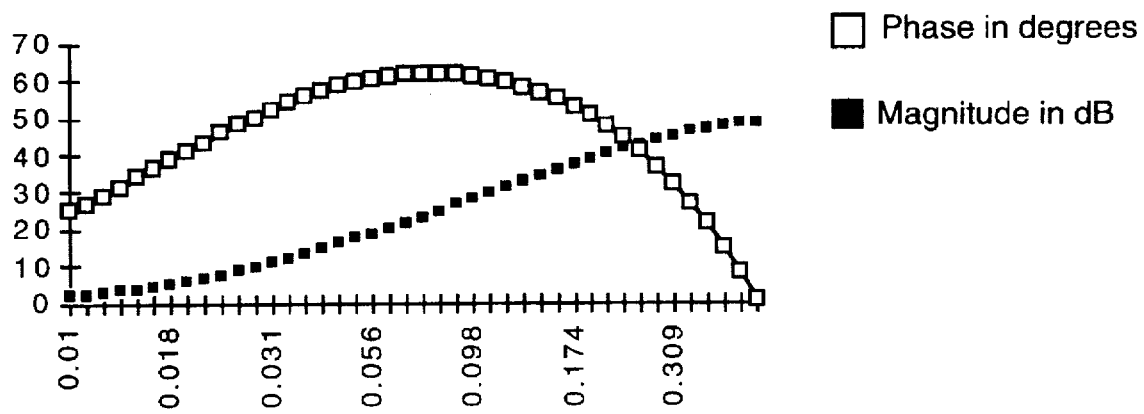
FIG. 10 depicts results of a simulation illustrating the lead-lag network with m=4.

Substituting $z = e^{j2\pi r} = \cos 2\pi r + j\sin 2\pi r$, and letting m=4, results in $$H(z) = \frac{17 - 15z^{-1}}{2} \text{ or } H(r) = \frac{17 - 15(\cos 2\pi r - j\sin 2\pi r)}{2}$$

which plots as shown in FIG. 10. Recalling that U(s)=H(s)·e(s) and employing the above substitution results in the expression $$U(z) = \left\{ \frac{17}{2} - \frac{15}{2} z^{-1} \right\} \cdot e(z)$$

which defines the transfer function of the controller using a discrete-time lead-lag transfer function.

Figure 11:
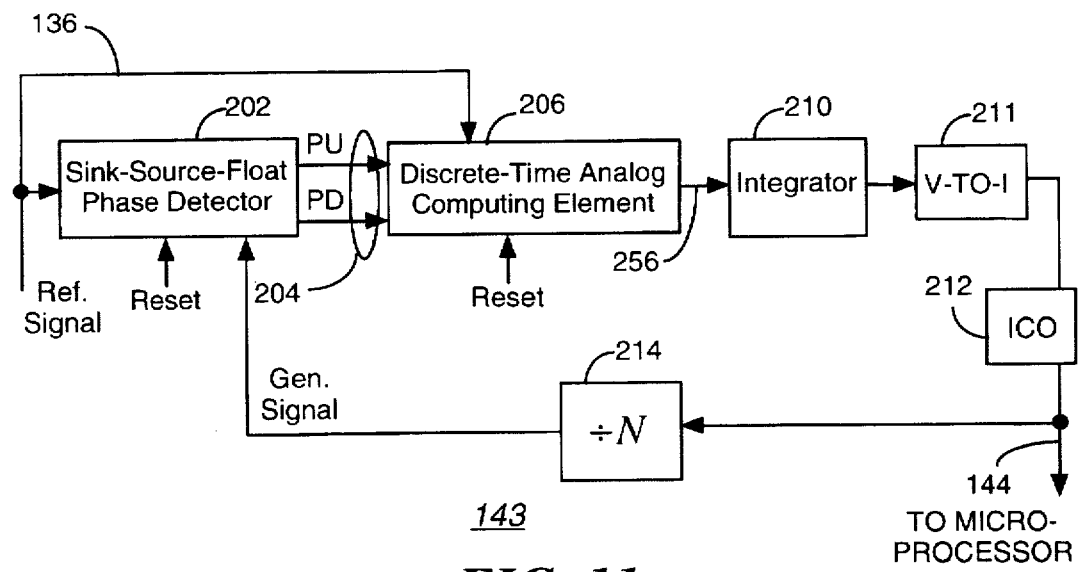
FIG. 11 is a closed loop electrical block diagram of a phase lock loop of the synthesizer in accordance with the preferred embodiment of the present invention.

FIG. 11 is a closed loop electrical block diagram of a phase lock loop of the frequency synthesizer 143 of FIG. 1 in accordance with the preferred embodiment of the present invention. The synthesizer 143 includes the same elements as functionally described in FIG. 2 with the addition of a discrete-time analog computing element 206 which implements the discrete-time lead-lag transfer function [U(z)] derived above, as well as a modern control computing engine to be described below. It will be appreciated that at least a portion of the phase lock loop can be manufactured as an integrated circuit comprising circuit elements selected from a group consisting of the integrator 210, the controlled oscillator 212, the frequency divider 214, the phase error detector 202, and the computing element 206.

Figure 12:
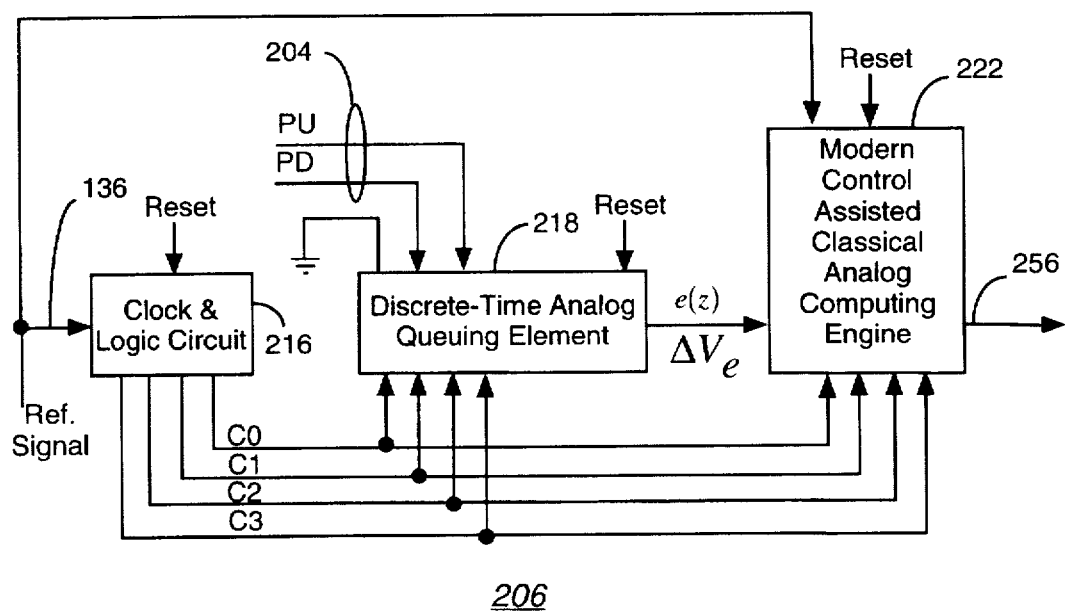
FIG. 12 is an electrical block diagram of a discrete-time analog computing element in accordance with the preferred embodiment of the present invention.

FIG. 12 is an electrical block diagram of the discrete-time analog computing element 206 in accordance with the preferred embodiment of the present invention. The discrete-time analog computing element 206 comprises a clock and logic circuit 216, a discrete-time analog queuing element 218, and a modern control assisted classical analog computing engine 222.

The clock and logic circuit 216 is driven by the reference signal 136 generated by the oscillator 135. The clock and logic circuit 216 preferably utilizes a conventional Johnson Counter to produce glitchless clock outputs (C0 through C3). Only one clock bit is active-high (i.e., a binary one) at one time. The clock outputs are coupled to both the discrete-time analog queuing element 218 and the analog computing engine 222.

The discrete-time analog queuing element 218 is coupled to an input node 204 comprising pull-up (PU) and pull-down (PD) signals which are sourced by the sink-source-float phase detector 202. As is well known by one of ordinary skill in the art, only one of the PU and PD signals of input node 204 is active at one time. Although the inactive signal may contain a short glitch, it is considered negligible for this application. The discrete-time analog queuing element 218 is also coupled to a ground signal reference for reset purposes (as will be described below), and a signal line labeled as $e^{(z)}$ (or equivalently $\Delta V_e$).

The e(z) signal generated by the discrete-time analog queuing element 218 is coupled to the input of the analog computing engine 222. Similarly, the analog computing engine 222 is coupled to the clock signals of the clock and logic circuit 216, and the reference signal 136. Once the analog computing engine 222 has completed a computation, an output node 256 of the analog computing engine 222 generates a signal which is coupled to the input of the integrator 210 of FIG. 11.

The integrator 210 then processes the signal generated by the discrete-time analog computing element 206 and creates a signal which is coupled to the V-TO-I converter 211. The current signal generated by the V-TO-I converter 211 is coupled to the ICO 212, thereby controlling the frequency signal 144 generated. The frequency signal 144 is coupled to both the microprocessor 137 and to the divide by N frequency divider 214. The generated signal created by the divide by N frequency divider 214 is coupled to the sink-source-float phase detector 202. The sink-source-float phase detector 202 continuously samples the reference signal 136 and the generated signal to generate a plurality of discrete-time phase error samples. Each discrete-time phase error sample feeds into the discrete-time analog computing element 206 thereby commencing a new cycle in frequency adjustment. The process continues until the frequency synthesizer 143 achieves phase lock.

Figure 13:
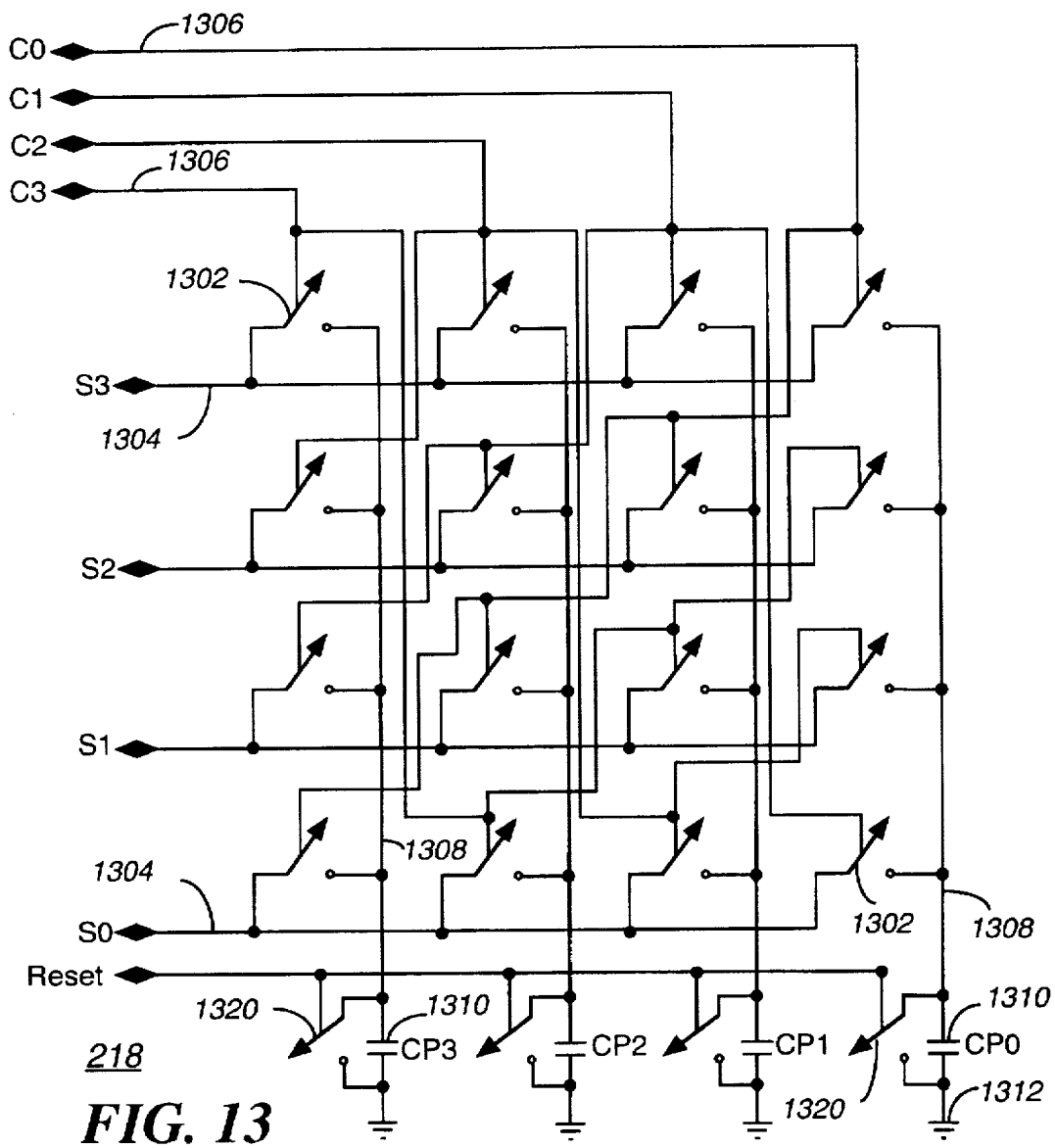
FIG. 13 is a detailed electrical block diagram of a switching matrix included in a discrete-time analog queuing element in accordance with the preferred embodiment of the present invention.

FIG. 13 is a detailed electrical block diagram of the switching matrix included in the discrete-time analog queuing element 218 in accordance with the preferred embodiment of the present invention. The discrete-time analog queuing element 218 comprises N analog signal lines 1304, where N is a positive integer, N analog storage lines 1308, and N control lines 1306. The discrete-time analog queuing element 218 further includes $N^2$ controllable switches 1302. The controllable switches 1302 preferably utilize conventional transmission gate switches, similar to the Motorola MC4066 switch manufactured by Motorola, Inc. Each controllable switch 1302 is coupled between one of the N analog signal lines 1304 and one of the N analog storage lines 1308. There are also N charge storage elements 1310. Each charge storage element 1310 is coupled between one of the N analog storage lines 1308 and a common circuit node 1312 (i.e., signal ground).

Each control line 1306 is coupled to N of the $N^2$ controllable switches 1302, and controls the controllable switches 1302 in response to the control lines 1306 being activated in a predetermined sequence. Each of the analog storage lines 1308 is coupled in turn to each of the analog signal lines 1304 in a sequence having a predetermined rotating order, wherein the predetermined rotating order is identical for each of the analog storage lines 1308, except that the sequence corresponding to each of the analog storage lines 1308 begins with a different one of the analog signal lines 1304. In addition, there are N controllable reset switches 1320 each coupled across one of the N charge storage elements 1310 for discharging the charge storage elements 1310 in response to a Reset signal.

In this example N=4. Therefore, there are four control lines 1306 (C0 through C3), four analog signal lines 1304 (S0 through S3), four analog storage lines 1308, sixteen controllable switches 1302, four controllable reset switches 1320, and four charge storage elements 1310 (CP0 through CP3).

Figure 14:
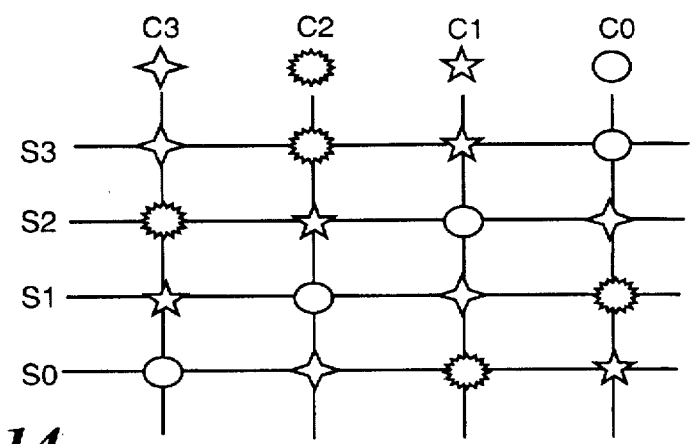
FIG. 14 is an illustration of the interconnectivity of the switching matrix included in the discrete-time analog queuing element in accordance with the preferred embodiment of the present invention.

FIG. 14 is an illustration of the interconnectivity of the controllable switches 1302 of the discrete-time analog queuing element 218 in accordance with the preferred embodiment of the present invention. For illustration purposes the control lines 1306 have each been given symbol. Recalling that only one control line 1306 is active at one time, when control line C0 is active only the switches 1302 with C0's symbol are closed. That is, S3 is connected with CP0, S2 is connected to CP1, S1 is connected with CP2, and S0 is connected with CP0. When C1 is active, S3 is connected to CP1, S2 is connected to CP2, S1 is connected to CP3, and S0 is connected to CP0. Operation in response to C2 and C3 is similar to that in response to C0 and C1.

The discrete-time analog queuing element 218 of FIGS. 12 and 13 has the analog signal line S0 connected to a reference circuit node, such as signal ground (G) for setting a predetermined charge and resultant voltage, e.g., zero volts, on the charge storage elements 1310. S1 is connected to PD, S2 is connected to PU, and S3 generates the output signal e(z) or equivalently $\Delta V e$. Table 1 below shows how signals are queued by the discrete-time analog queuing element 218.

TABLE 1

| Queuing Example | | | |
|---|---|---|---|
| CP3 | CP2 | CP1 | CP0 |
| C1 PD | PU | S3 | G |
| C2 PU | S3 | G | PD |
| C3 S3 | G | PD | PU |
| C0 G | PD | PU | S3 |
| C1 PD | PU | S3 | G |
| C2 PU | S3 | G | PD |
| C3 S3 | G | PD | PU |

Each column of Table 1 represents a charge storage element CP0–CP3 in the switch matrix, while each row represents a single active control line C0–C3. Recall that only one control line is active at each instance of the reference signal 136. The first row shows the control signal C1 active. During this time, the PD signal generated by the sink-source-float phase detector 202 is connected to CP3, the PU signal generated by the sink-source-float phase detector 202 is connected to CP2, the source signal S3 which generates e(z) is connected to CP1, and CP0 is connected to ground (i.e., reset). Similarly, when control line C2 is active CP3 is connected to the PU signal, CP2 is connected to the source signal S3, CP1 is reset, and CP0 is connected to the PD signal. Note as previously mentioned, only one of the PU and PD signals generated by the sink-source-float phase detector 202 is active at one time. Therefore, when a control line is active either PU or PD is ineffectual. Also note, as highlighted, that the sequence of queuing is a reset, followed on the next control cycle by PD, followed by PU, and finally followed by S3 where the stored signal is delivered as the e(z) signal. Essentially the discrete-time analog queuing element 218 provides a discrete-time analog queue for the signal e(z), delivering one phase error sample per cycle of the reference signal 136.

Figure 15:
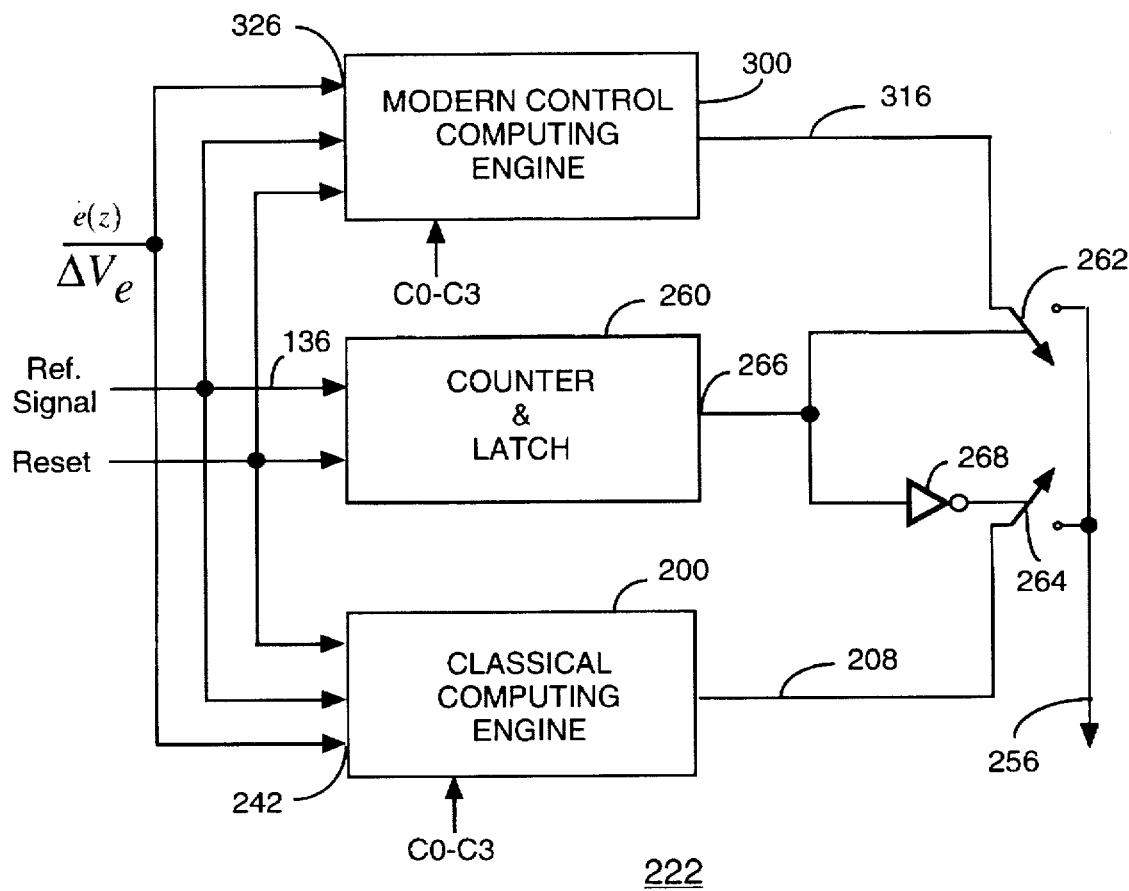
FIG. 15 is an electrical block diagram of a modern control assisted classical computing engine in accordance with the preferred embodiment of the present invention.

FIG. 15 is a simplified electrical block diagram of the modern control assisted classical analog computing engine 222. The analog computing engine 222 comprises a modern control computing engine 300, a classical computing engine 200, and a conventional counter and latch circuit 260, which determines which one of the two computing engines 200, 300 controls the synthesizer 143 at any given time. Inputs 242, 326 of the classical and modern control computing engines 200, 300 are coupled to the e(z) signal from the discrete-time analog queuing element 218 for receiving $\Delta V e$.

11

The reference signal 136 and a reset signal are also coupled to both computing engines 200, 300 and to the counter and latch circuit 260. An output node 208 of the classical computing engine 200 is coupled through a conventional controlled switch 264 to the output node 256 of the analog computing engine 222. Similarly, an output node 316 of the modern control computing engine 300 is coupled through a conventional controlled switch 262 to the output node 256 of the analog computing engine 222.

Operation of the counter and latch circuit 260 is such that following assertion of the reset signal, the counter and latch circuit 260 counts the cycles of the reference signal 136 in a counter. When the counter reaches a predetermined count, e.g., eight cycles of the reference signal 136, a latch is set and remains set until the reset signal is again asserted. The latch of the counter and latch circuit 260 provides an output logic signal 266 for controlling the controlled switches 262, 264. An inverter 268 inverts the output logic signal 266 that controls the controlled switch 264. Thus, following the assertion of the reset signal, the modern control computing engine 300 is coupled to the output node 256 for controlling the synthesizer 143. Then after the counter reaches the predetermined count, the classical computing engine 200 is coupled to the output node 256 for controlling the synthesizer 143. The classical computing engine 200 continues to control the synthesizer 143 until the reset signal is again asserted.

Figure 16:
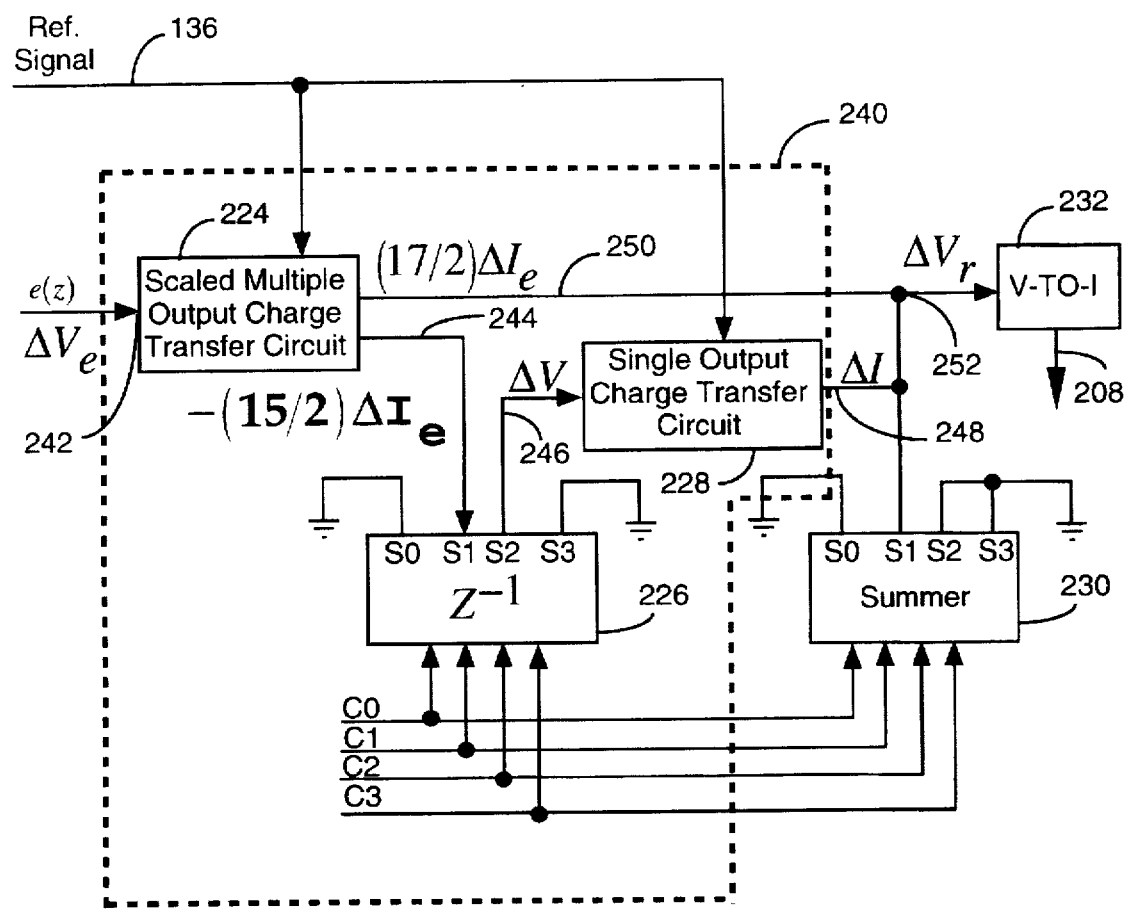
FIG. 16 is a detailed electrical block diagram of a classical computing engine in accordance with the preferred embodiment of the present invention.

FIG. 16 is a detailed electrical block diagram of the classical computing engine 200 in accordance with the preferred embodiment of the present invention. Once e(z) has been generated, the analog computing engine 222 applies the discrete-time lead-lag transfer function to e(Z), that is, $$U(z) = \left\{ \frac{17}{2} - \frac{15}{2} z^{-1} \right\} \cdot e(z).$$

The classical computing engine 200 includes another discrete-time analog queuing element 240, expanded to comprise a scaled multiple output charge transfer circuit 224, a discrete-time analog queuing element similar to the discrete-time analog queuing element 218, but connected in a way as to function as a single clock delay $z^{-1}$ element 226, and a single output charge transfer circuit 228. The charge transfer circuit 224 has an input 242 for receiving the error signal e(z) in the form of a voltage change $\Delta V_e$ and a first output 250 coupled to a summing node 252. The charge transfer circuit 224 also has a second output 244 coupled to one of the analog signal lines S1 of the single clock delay element 226 for delivering thereto a charge proportional to the input voltage change $\Delta V_e$. The charge transfer circuit 228 has an input 246 coupled to one of the analog signal lines S2 of the single clock delay element 226 for receiving therefrom an input voltage change $\Delta V$. The charge transfer circuit 228 also has an output 248 for providing a current pulse signal $\Delta I$ comprising a charge proportional to $\Delta V$. The classical computing engine 200 also includes another discrete-time analog queuing element similar to the discrete-time analog queuing element 218, but connected in a way as to function as a summer 230, and a voltage-to-current (V-TO-I) converter 232.

The scaled multiple output charge transfer circuit 224 further receives the reference signal 136 for clocking the charge transfer circuit, as will be described shortly below. The voltage signal $\Delta V_e$ is converted and scaled to two current pulses $(17/2)\Delta I_e$ and $(15/2)\Delta I_e$.

The current pulse $(15/2)\Delta I_e$ is coupled to the single clock delay $z^{-1}$ element 226 which delays the generation of the equivalent voltage pulse $\Delta V$ by one clock cycle of the reference signal 136. To configure a discrete-time queuing element 218 as a single clock delay $Z^{-1}$ element 226 the analog signal lines are connected such that S3 is connected to ground, S2 is connected to $\Delta V$, S1 is connected to $(15/2)\Delta I_e$, and S0 is connected to ground. Table 2 illustrates how the current pulse $(15/2)\Delta I_e$ is delayed by one clock cycle thereby generating the voltage pulse $\Delta V$.

TABLE 2

Signal Sequence for Single Clock Delay Discrete-Time Analog Queuing Element

| | CP3 | CP2 | CP1 | CP0 |
|---|---|---|---|---|
| C1 | $(15/2)\Delta I_e$ | $\Delta V$ | G | G |
| C2 | $\Delta V$ | G | G | $(15/2)\Delta I_e$ |
| C3 | G | G | $(15/2)\Delta I_e$ | $\Delta V$ |
| C0 | G | $(15/2)\Delta I_e$ | $\Delta V$ | G |
| C1 | $(15/2)\Delta I_e$ | $\Delta V$ | G | G |
| C2 | $\Delta V$ | G | G | $(15/2)\Delta I_e$ |

The highlighted sections of Table 2 illustrate the sequence of events which result in a single clock delayed output of the signal $(15/2)\Delta I_e$. For example, at C1 CP0 is reset (i.e., grounded). At C2, CP0 receives the pulse signal $(15/2)\Delta I_e$ which is stored as a charge voltage $\Delta V$. One clock cycle later of the reference signal 136 when C3 is active, CP0 sources the output signal $\Delta V$. Note the same sequence rotates from CP0 through CP3.

The voltage pulse $\Delta V$ is coupled to the single output charge transfer circuit 228 which converts the pulse signal to an equivalent current pulse signal $\Delta I$. The current pulse signal $\Delta I$ is then combined simultaneously with the current pulse signal $(17/2)\Delta I_e$ in the summer 230 generating a resultant voltage pulse signal $\Delta V_r$. The voltage pulse signal $\Delta V_r$ is converted to a current signal by the conventional V-TO-I converter 232 representative of the output node 208 of the classical computing engine 200. This signal also represents the processing of the signal e(z) by the discrete-time lead-lag transfer function mentioned above. The summer 230 exchanges a charge from CP0 through CP1 as shown in Table 3.

TABLE 3

| | Summer | | | |
|---|---|---|---|---|
| | CP3 | CP2 | CP1 | CP0 |
| C1 | $\Delta V_r$ | G | G | G |
| C2 | G | G | G | $\Delta V_r$ |
| C3 | G | G | $\Delta V_r$ | G |
| C0 | G | $\Delta V_r$ | G | G |
| C1 | $\Delta V_r$ | G | G | G |

It will be appreciated that, alternatively, the single clock delay $Z^{-1}$ element 226, and the summer 230 can be implemented with a two-by-two version of the discrete-time analog queuing element 218 of FIG. 13 with two phase clocking.

Figure 17:
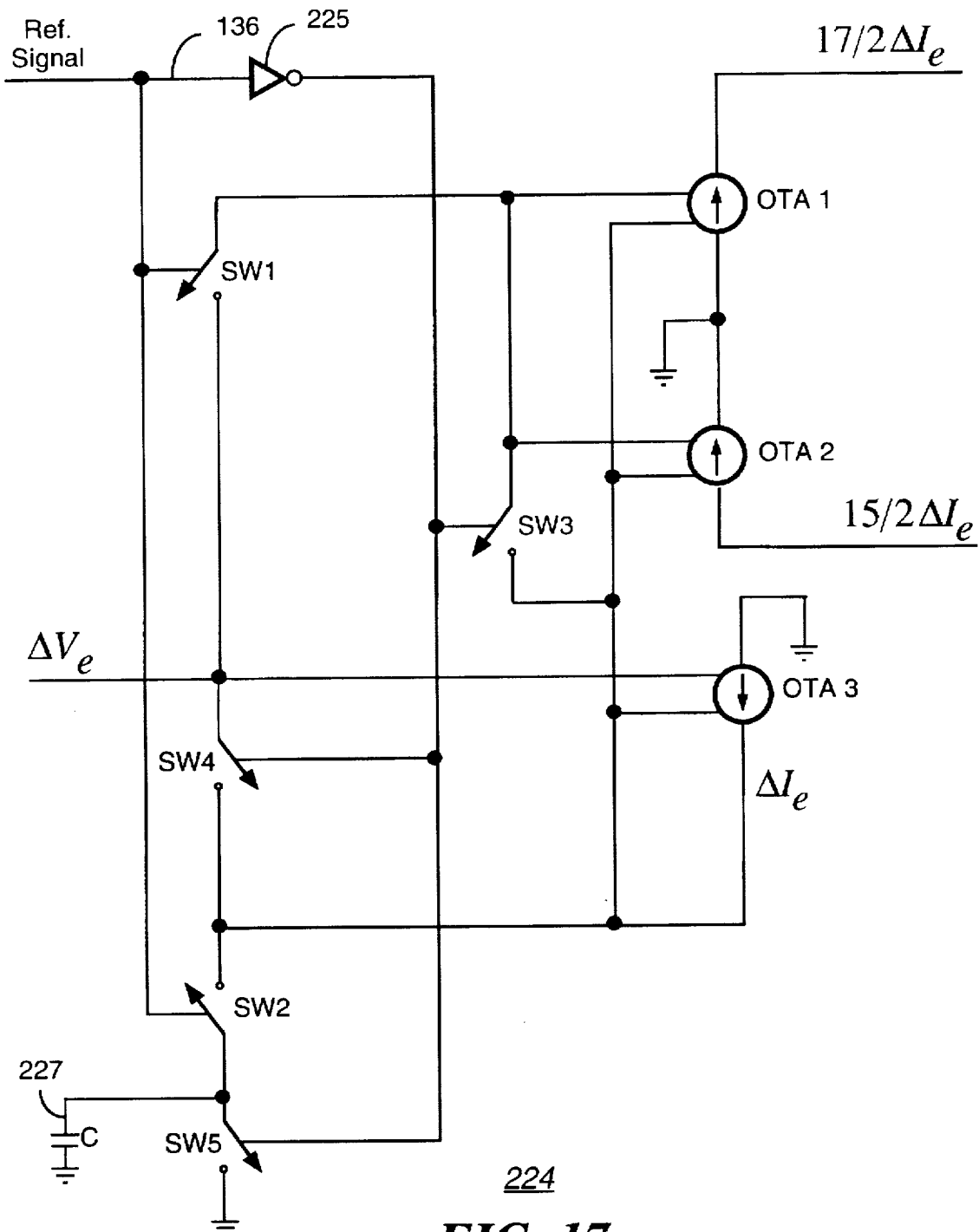
FIG. 17 is a detailed electrical block diagram of a scaled multiple output charge transfer circuit used with the classical computing engine in accordance with the preferred embodiment of the present invention.

FIG. 17 is a detailed electrical block diagram of the scaled multiple output charge transfer circuit 224 in accordance with the preferred embodiment of the present invention. The scaled multiple output charge transfer circuit 224 includes three operational transconductance amplifiers (OTA 1, OTA 2 and OTA 3 shown by way of example). The OTAs are conventional transconductance circuits, such as described in "Analog VLSI and Neural Systems" by Carver Mead, pp 67–82. The scaled multiple output charge transfer circuit 224 further includes switches (SW1, SW2, SW3, SW4 and SW5 shown by way of example) which can be realized by utilizing transmission gate switches, similar to the Motorola MC4066. The scaled multiple output charge transfer circuit 224 also includes a conventional logic inverter 225 for inverting the reference signal 136, and a reference charge storage element 227. As mentioned above, the scaled multiple output charge transfer circuit 224 has two inputs which include the reference signal 136 and the voltage signal $\Delta V_e$, and two outputs comprising the currents pulse signals (17/2)$\Delta I_e$ and $-(15/2)\Delta I_e$.

The switches shown are active-high switches (i.e., they close with a logic "1" signal). When the reference signal 136 is in a low state (i.e., "0"), switches SW3, SW4 and SW5 are closed, and switches SW1 and SW2 are open. This is considered the reset state of the scaled multiple output charge transfer circuit 224. In this state the closure of switch SW3 and SW4 cause a short circuit across the differential inputs of OTA 1, OTA 2 and OTA 3. Additionally, closure of S5 discharges the reference charge storage element 227.

When the reference signal 136 is active (i.e., a logic "1" signal) switches SW1 and SW2 are closed while switches SW3, SW4 and SW5 are open. At the same time the voltage signal $\Delta V_e$ is provided at the input of the scaled multiple output charge transfer circuit 224. The voltage signal $\Delta V_e$ is connected to the upper terminals of OTA 1, OTA 2 and OTA 3. OTA 3 charges the reference charge storage element 227 to the same level as $\Delta V_e$. Charging to $\Delta V_e$ requires an electric charge of $\Delta V_e \times C$. This charge is delivered from OTA 3 in the form of a current pulse $\Delta I_e$ as shown. The upper OTAs 1 and 2, operate as current mirrors scaled to factors of 17/2 and −15/2 of $\Delta I_e$, respectively. Once the differential terminals of OTAs 1, 2 and 3 are at the same voltage, the current pulse ceases. Before the next rising edge of the reference signal 136, the OTAs and the reference charge storage element 227 are reset as described above.

Figure 18:
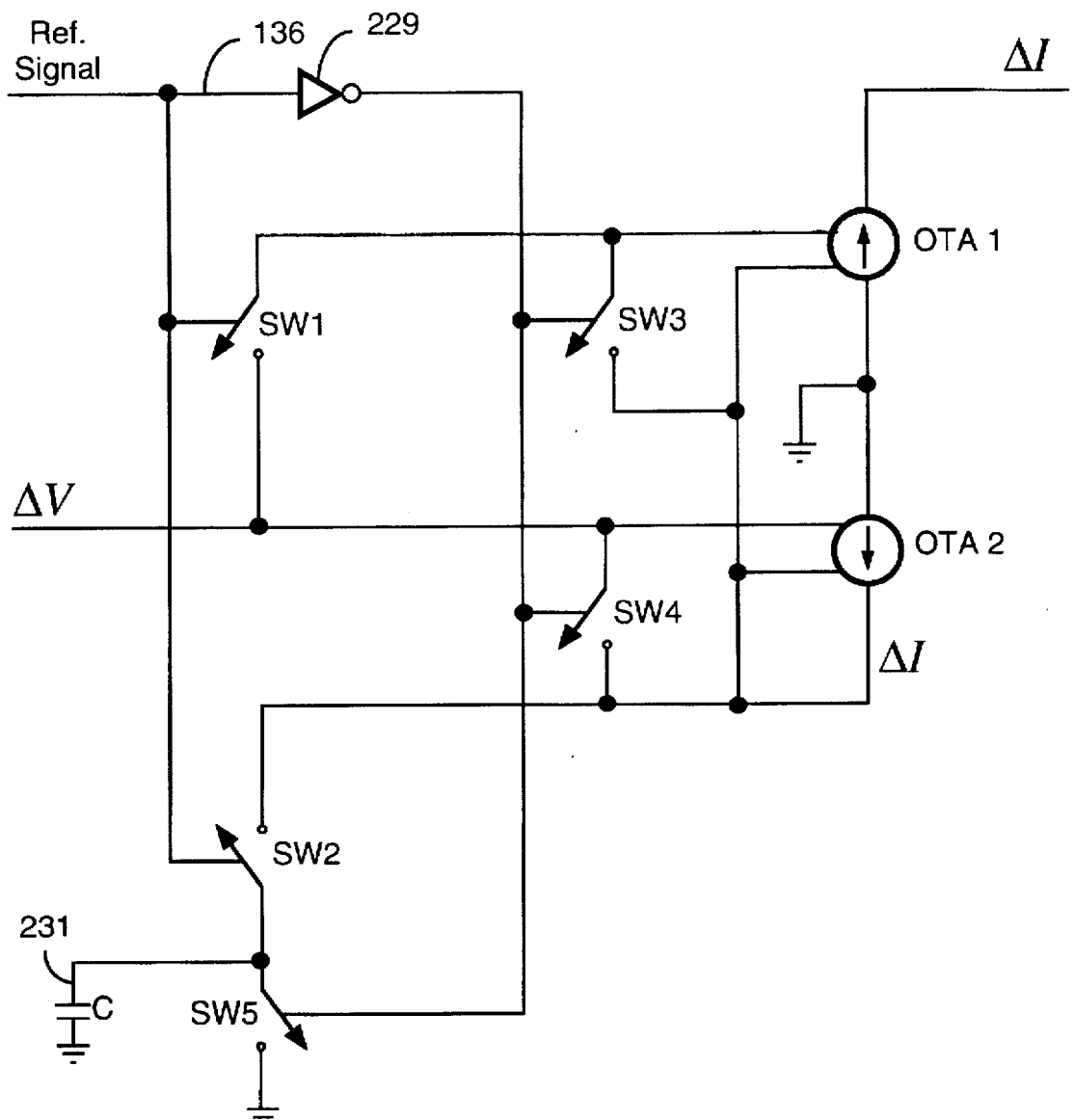
FIG. 18 is a detailed electrical block diagram of a single output charge transfer circuit used with the classical computing engine in accordance with the preferred embodiment of the present invention.

FIG. 18 is a detailed electrical block diagram of the single output charge transfer circuit 228 in accordance with the preferred embodiment of the present invention. This circuit operates similar to the circuit of FIG. 16 with the exception that the circuit provides a single output and is scaled for a one to one ratio. The single output charge transfer circuit 228 includes five switches, two OTAs, a reference charge storage element 231, and a logic inverter 229. As mentioned above, the single output charge transfer circuit 228 has two inputs comprising the reference signal 136 and the voltage signal $\Delta V$, and one output comprising the current signal $\Delta I$.

The single output charge transfer circuit 228 is in the reset state when the reference signal 136 is in the low state. In this state switches SW3, SW4 and SW5 are closed while SW1 and SW2 are open. As before, the differential inputs of the OTAs are shorted, and the reference charge storage element 231 is discharged to ground. When the reference signal 136 becomes active switches SW1 and SW2 are closed while switches SW3, SW4 and SW5 are open. At the same time that the reference signal 136 becomes active, the signal $\Delta V$ is provided at the input of the single output charge transfer circuit 228. The voltage signal $\Delta V$ is connected to the upper terminals of OTA 1 and OTA 2. OTA 2 charges the reference charge storage element 231 to the same level as $\Delta V$. Charging to $\Delta V$ requires an electric charge of $\Delta V \times C$. This charge is delivered from OTA 2 in the form of a current pulse $\Delta I$ as shown. OTA 1 operates as a current mirror which delivers the signal $\Delta I$ at the output. Once the differential terminals of OTAs 1 and 2 are at the same voltage, the current pulse ceases. Before the rising edge of the reference signal 136, the OTAs and the reference charge storage element 231 are reset as described above.

Application of Modern Control Theory

Before discussing a specific implementation of the modern control computing engine 300 it is appropriate to describe the theory behind the implementation.

Examination of the transfer functions derived for the classical analysis of the open loop system shows a double integrator with additional delay. Modern control theory shows that this is a second order state-space system with additional delay, and theorizes that a discrete-time controller can be constructed to drive a second order system to zero state-space error using a two component control signal. By contrast, the Classical Control Theory solves for the controller conditions that satisfy the final value theorem of zero error as time approaches infinity.

We use the reference signal 136 to determine a natural discrete-time interval, since we obtain a new phase measurement once each cycle of the reference, and we induce a control signal with two successive phases, each half of the discrete-time interval in duration but of controllable amplitude. The implication from modern control theory is that we can achieve zero error in two cycles of the reference, while the best classical controllers require 44 to 50 cycles of the reference to settle within acceptable error bounds. The following traces the efforts to realize a method and apparatus to achieve the results predicted by the theory.

For a piecewise-constant controller (first half-cycle control $u_1$ and second half-cycle control $u_2$), we show that in the time domain, the instantaneous frequency error over the first half-cycle is given by:

$$\dot{\epsilon}[nT_s+t] = \int_0^t K \cdot u_1[(n-2)T_s] d\lambda + \dot{\epsilon}[nT_s],$$

which integrates to $\epsilon^{\bullet}[nT_s+t]=K\bullet u_1[(n-2)T_s]\bullet t+\epsilon^{\bullet}[nT_s]$, and evaluating at $t=T_s$, $\epsilon^{\bullet}[(n+1)T_s]=KT_s\bullet u_1[(n-2)T_s]+\epsilon^{\bullet}[nT_s]$, and similarly, [3]

$\epsilon^{\bullet}[(n+2)T_s]=KT_s\bullet u_2[(n-2)T_s]+\epsilon^{\bullet}[(n+1)T_s]$ Substituting:

$\epsilon^{\bullet}[(n+2)T_s]=KT_s\bullet u_2[(n-2)T_s]+KT_s\bullet u_1[(n-2)T_s]+\epsilon^{\bullet}[nT_s]$, [4]

$\epsilon^{\bullet}[(n+3)T_s]=KT_s\bullet u_1[nT_s]+KT_s\bullet u_2[(n-2)T_s]+KT_s\bullet u_1[(n-2)T_s]+\epsilon^{\bullet}[nT_s]$, and [5]

$\epsilon^{\bullet}[(n+4)T_s]=KT_s\bullet u_2[nT_s]+KT_s\bullet_1[nT_s]+KT_s\bullet u_2[(n-2)T_s]+KT_s\bullet u_1[(n-2)T_s]+\epsilon^{\bullet}[nT_s]$. [6]

A similar result can be derived for the phase error:

$$\epsilon[nT_s+t] = \int_0^t \dot{\epsilon}[(nT_s+\lambda)T_s] d\lambda + \epsilon[nT_s],$$

which provides $$\epsilon[nT_s+t] = \int_0^t \{u_1[(n-2)T_s] \cdot K\lambda + \dot{\epsilon}[nT_s]\} d\lambda + \epsilon[nT_s],$$

or

-continued $\epsilon[nT_s + t] = u_1[(n-2)T_s] \cdot \frac{Kt^2}{2} + \dot{\epsilon}[nT_s] \cdot t + \epsilon[nT_s],$ so, at $t = T_s$ $\epsilon[(n+1)T_s] = \frac{KT_s^2}{2} \cdot u_1[(n-2)T_s] + T_s \cdot \dot{\epsilon}[nT_s] + \epsilon[nT_s],$ [7]

also $\epsilon[(n+2)T_s] = \frac{KT_s^2}{2} \cdot u_2[(n-2)T_s] + T_s \cdot \dot{\epsilon}[(n+1)T_s] + \epsilon[(n+1)T_s],$ [8]

$\epsilon[(n+3)T_s] = \frac{KT_s^2}{2} \cdot u_1[nT_s] + T_s \cdot \dot{\epsilon}[(n+2)T_s] + \epsilon[(n+2)T_s],$ [9]

and $\epsilon[(n+4)T_s] = \frac{KT_s^2}{2} \cdot u_1[nT_s] + T_s \cdot \dot{\epsilon}[(n+3)T_s] + \epsilon[(n+3)T_s].$ [10]

Substituting equation [7] into [8], and the result into [9], and that result into [10], we get:

$\epsilon[(n+4)T_s] = \epsilon[nT_s] + \frac{KT_s^2}{2} \cdot$ [11]

$\{u_2[nT_s] + u_1[nT_s] + u_2[(n-2)T_s] + u_1[(n-2)T_s]\} +$ $T_s \cdot \{\dot{\epsilon}[(n+3)T_s] + \dot{\epsilon}[(n+2)T_s] + \dot{\epsilon}[(n+1)T_s] + \dot{\epsilon}[nT_s]\}$ Into [11], we substitute [3], [4], and [5] to obtain:

$\epsilon[(n+4)T_s] = \epsilon[nT_s] + 4 T_s \cdot \dot{\epsilon}[nT_s] + \frac{KT_s^2}{2} \cdot$ [12]

$\{u_2[nT_s] + u_1[nT_s] + u_2[(n-2)T_s] + u_1[(n-2)T_s]\} + \frac{KT_s^2}{2} \cdot$ $\{2u_1[nT_s] + 4u_2[(n-2)T_s] + 6u_1[(n-2)T_s]\},$ or $\epsilon[(n+4)T_s] = \epsilon[nT_s] + 4 T_s \cdot \dot{\epsilon}[nT_s] + \frac{KT_s^2}{2} \cdot$ $\{u_2[nT_s] + 3u_1[nT_s] + 5u_2[(n-2)T_s] + 7u_1[(n-2)T_s]\}$ To develop a controller, first we examine equations [6] and [12], to predict the state of the system errors four half-cycles in the future, and realize they are functions of: present values of the phase and frequency errors, the history of control inputs that still have an effect on error states, and new control inputs we supply to the system. A complication arises because we do not have direct measurements of frequency error, but can compute values given additional historical phase errors. To compute, return to equation [8], and substitute equations [3] and [7] to provide:

$\epsilon[(n+2)T_s] = \frac{KT_s^2}{2} \cdot u_2[(n-2)T_s] + T_s \cdot$ $\{KT_s \cdot u_1[(n-2)T_s] + \dot{\epsilon}[nT_s]\} + \frac{KT_s^2}{2} \cdot$ $u_1[(n-2)T_s] + T_s \cdot \dot{\epsilon}[nT_s] + \epsilon[nT_s],$ or $\epsilon[(n+2)T_s] = \frac{KT_s^2}{2} \cdot u_2[(n-2)T_s] + \frac{3KT_s^2}{2} \cdot$ $u_1[(n-2)T_s] + 2T_s \cdot \dot{\epsilon}[nT_s] + \epsilon[nT_s],$ which implies the history:

$\epsilon[nT_s] = \frac{KT_s^2}{2} \cdot u_2[(n-4)T_s] + \frac{3KT_s^2}{2} \cdot u_1[(n-4)T_s] +$ $2T_s \cdot \dot{\epsilon}[(n-2)T_s] + \epsilon[(n-2)T_s],$ so explicitly:

$2T_s \cdot \dot{\epsilon}[(n-2)T_s] = \epsilon[nT_s] - \epsilon[(n-2)T_s] -$ [13]

$\frac{KT_s^2}{2} \cdot u_2[(n-4)T_s] - \frac{3KT_s^2}{2} \cdot u_1[(n-4)T_s],$ or $\dot{\epsilon}[(n-2)T_s] = \frac{1}{2T_s} \{\epsilon[nT_s] - \epsilon[(n-2)T_s]\} -$ $\frac{KT_s}{4} \{u_2[(n-4)T_s] + 3u_1[(n-4)T_s]\}$ Likewise, equation [2] implies, from the system history:

$\dot{\epsilon}[nT_s] = KT_s \bullet u_2[(n-4)T_s] + KT_s \bullet u_1[(n-4)T_s] + \dot{\epsilon}[(n-2)T_s],$ so that $\dot{\epsilon}[nT_s] = KT_s \cdot u_2[(n-4)T_s] + KT_s \cdot u_1[(n-4)T_s] \frac{1}{2T_s} \{\epsilon[nT_s] -$ $\epsilon[(n-2)T_s]\} - \frac{KT_s}{4} \{u_2[(n-4)T_s] + 3u_1(n-4)T_s]\},$ and $\dot{\epsilon}[nT_s] = \frac{1}{2T_s} \{\epsilon[nT_s] - \epsilon[(n-2)T_s]\} +$ [14]

$\frac{KT_s}{4} \{3u_2[(n-4)T_s] + u_1[(n-4)T_s]\}$

Computation of frequency error from successive phase error measurements allows substitution reduction of equations [6] and [12], to predict the state of the system errors four half-cycles in the future and obtain:

$\dot{\epsilon}[(n+4)T_s] = \frac{1}{2T_s} \{\epsilon[nT_s] - \epsilon(n-2)T_s\} + KT_s \cdot u_2[nT_s] + KT_s \cdot$ $u_1[nT_s] + KT_s \cdot u_2[(n-2)T_s] + KT_s \cdot u_1[(n-2)T_s] +$ $\frac{KT_s}{4} \{3u_2[(n-4)T_s] + u_1[(n-4)T_s]\},$ and $\epsilon[(n+4)T_s] = \epsilon[nT_s] + \{2\epsilon[nT_s] - 2\epsilon[(n-2)T_s]\} +$ $\frac{KT_s^2}{2} \cdot \{u_2[nT_s] + 3u_1[nT_s] + 5u_2[(n-2)T_s] + 7u_1[(n-2)T_s]\} +$ $\frac{KT_s^2}{2} \{6u_2[(n-4)T_s] + 2u_1[(n-4)T_s]\},$ so we simplify to obtain:

$\dot{\epsilon}[(n+4)T_s] = \frac{1}{2T_s} \{\epsilon[nT_s] - \epsilon[(n-2)T_s]\} +$ [15]

$\frac{KT_s}{4} \{4u_2[nT_s] + 4u_2[(n-2)T_s] + 3u_2[(n-4)T_s]\} +$ $\frac{KT_s}{4} \{4u_1[nT_s] + 4u_1[(n-2)T_s] + u_1[(n-4)T_s]\},$ and, $\epsilon[(n+4)T_s] = 3\epsilon[nT_s] - 2\epsilon[(n-2)T_s] +$ [16]

$\frac{KT_s^2}{2} \cdot \{u_2[nT_s] + 5u_2[(n-2)T_s] + 6u_2[(n-4)T_s]\} +$ $$\frac{KT_s^2}{2} \cdot \{3u_1[nT_s] + 7u_1[(n-2)T_s] + 2u_1[(n-4)T_s]\}.$$

We are able to control the two error state variables $\epsilon$ and $\epsilon^\bullet$ for the system behavior four half-cycles in the future, by setting the two control variables $u_1$ and $u_2$. The important implications of equations [15] and [16] are that we can achieve any set of states for $\epsilon$ and $\epsilon^\bullet$ at a time four half-cycles in the future, by selecting appropriate present values for the two control variables $u_1$ and $u_2$. We can construct, from the predictor equations above, the controller to provide any arbitrary frequency or phase modulation, including static phase or frequency offsets. The ideal particular behavior for the frequency synthesis system is obtained for both $\epsilon=0$, and $\epsilon^\bullet=0$, which we can achieve at four half-cycles in the future, by calculating the present values of the two control variables $u_1$ and $u_2$ necessary to provide that particular state. To calculate the controller equations for the frequency synthesis system equivalent to the classical design, we solve:

$$\epsilon[(n+4)T_s] = 0 = \frac{1}{2T_s} \{\epsilon[nT_s] - \epsilon[(n-2)T_s]\} + \quad [17]$$

$$\frac{KT_s}{4} \{4u_2[nT_s] + 4u_2[(n-2)T_s] + 3u_2[(n-4)T_s]\} +$$

$$\frac{KT_s}{4} \{4u_1[nT_s] + 4u_1[(n-2)T_s] + u_1[(n-4)T_s]\},$$

and $\epsilon[(n+4)T_s] = 0 = 3\epsilon[nT_s] - 2\epsilon[(n-2)T_s] +$ $$\frac{KT_s^2}{2} \cdot \{u_2[nT_s] + 5u_2[(n-2)T_s] + 6u_2[(n-4)T_s]\} +$$

$$\frac{KT_s^2}{2} \cdot \{3u_1[nT_s] + 7u_1[(n-2)T_s] + 2u_1[(n-4)T_s]\},$$

or $\frac{KT_s}{4} \{4u_2[nT_s] + 4u_1[nT_s]\} = -\frac{1}{2T_s} \{\epsilon[nT_s] - \epsilon[(n-2)T_s]\} -$ $$\frac{KT_s}{4} \{4u_2[(n-2)T_s] + 3u_2[(n-4)T_s] + 4u_1[(n-2)T_s] + u_1[(n-4)T_s]\},$$

and $\frac{KT_s^2}{2} \{u_2[nT_s] + 3u_1[nT_s]\} = -3\epsilon[nT_s] + 2\epsilon[(n-2)T_s] - \frac{KT_s^2}{2} \cdot$ $$\{5u_2[(n-2)T_s] + 6u_2[(n-4)T_s] + 7u_1[(n-2)T_s] + 2u_1[(n-4)T_s]\},$$

so: $u_2[nT_s] + u_1[nT_s] = -\frac{1}{2KT_s^2} \{\epsilon[nT_s] - \epsilon[(n-2)T_s]\} -$ $$\frac{1}{4} \{4u_2[(n-2)T_s] + 3u_2[(n-4)T_s] + 4u_1[(n-2)T_s] + u_1[(n-4)T_s]\},$$

and $u_2[nT_s] + 3u_1[nT_s] = -\frac{1}{2KT_s^2} \{12\epsilon[nT_s] - 8\epsilon[(n-2)T_s]\} - \frac{1}{4} \cdot \quad [18]$ $$\{20u_2[(n-2)T_s] + 24u_2[(n-4)T_s] + 28u_1[(n-2)T_s] + 8u_1[(n-4)T_s]\},$$

We solve equations [17] and [18] simultaneously for $u_1$ and $u_2$, first by subtracting [17] from [18], then by subtracting [18] from 3●[17] to obtain, first:

$$2u_1[nT_s] = -\frac{1}{2KT_s^2} \{11\epsilon[nT_s] - 7\epsilon[(n-2)T_s]\} - \frac{1}{4} \cdot \quad [19]$$

$$\{16u_2[(n-2)T_s] + 21u_2[(n-4)T_s] + 24u_1[(n-2)T_s] + 7u_1[(n-4)T_s]\},$$

then $2u_2[nT_s] = \frac{1}{2KT_s^2} \{9\epsilon[nT_s] - 5\epsilon[(n-2)T_s]\} + \frac{1}{4} \cdot$ $$\{8u_2[(n-2)T_s] + 15u_2[(n-4)T_s] + 16u_1[(n-2)T_s] + 5u_1[(n-4)T_s]\},$$

so $u_1[nT_s] = -\frac{1}{4KT_s^2} \{11\epsilon[nT_s] - 7\epsilon[(n-2)T_s]\} - \frac{1}{8} \cdot$ $$\{16u_2[(n-2)T_s] + 21u_2[(n-4)T_s] + 24u_1[(n-2)T_s] + 7u_1[(n-4)T_s]\},$$

and $u_2[nT_s] = \frac{1}{4KT_s^2} \{9\epsilon[nT_s] - 5\epsilon[(n-2)T_s]\} + \frac{1}{8} \cdot \quad [20]$ $$\{8u_2[(n-2)T_s] + 15u_2[(n-4)T_s] + 16u_1[(n-2)T_s] + 5u_1[(n-4)T_s]\}.$$

For further simplification, we reparameterize with:

$$\beta(t) = \frac{\epsilon(t)}{\left[\frac{k \cdot T_s^2}{2}\right]}$$

which is proportional to phase error, so that:

$$u_1[nT_s] = -\frac{1}{8} \{11\beta[nT_s] - 7\beta[(n-2)T_s]\} - \frac{1}{8} \cdot \quad [21]$$

$$\{16u_2[(n-2)T_s] + 21u_2[(n-4)T_s] + 24u_1[(n-2)T_s] + 7u_1[(n-4)T_s]\},$$

and $u_2[nT_s] = \frac{1}{8} \{9\beta[nT_s] - 5\beta[(n-2)T_s]\} + \frac{1}{8} \cdot \quad [22]$ $$\{8u_2[(n-2)T_s] + 15u_2[(n-4)T_s] + 16u_1[(n-2)T_s] + 5u_1[(n-4)T_s]\}.$$

For ease of computation, we design a computation engine to supply the sampled-data functions represented by equations [21] and [22]; it uses the z-transform notation for which, in this case, we define: $z=e^{2sT}$ and produce:

$$U_1(z) = -\frac{1}{8} \{11 - 7z^{-1}\}\beta(z) - \quad [23]$$

$$\frac{1}{8} \{16z^{-1} + 21z^{-2}\}U_2(z) - \frac{1}{8} \{24z^{-1} + 7z^{-2}\}U_1(z),$$

and $U_2(z) = \frac{1}{8} \{9 - 5z^{-1}\}\beta(z) + \frac{1}{8} \{8z^{-1} + 15z^{-2}\}U_2(z) +$ $$\frac{1}{8} \{16z^{-1} + 5z^{-2}\}U_1(z),$$

or $-8U_1(z) = \{11 - 7z^{-1}\}\beta(z) +$ $$\{16z^{-1} + 21z^{-2}\}U_2(z) + \{24z^{-1} + 7z^{-2}\}U_1(z)8U_2(z) =$$

$$\{9 - 5z^{-1}\}\beta(z) + \{8z^{-1} + 15z^{-2}\}U_2(z) + \{16z^{-1} + 5z^{-2}\}U_1(z),$$

so $-\{11 - 7z^{-1}\}\beta(z) = \{16z^{-1} + 21z^{-2}\}U_2(z) +$ $$\{8 + 24z^{-1} + 7z^{-2}\}U_1(z),$$

and $-\{9 - 5z^{-1}\}\beta(z) = \{-8 + 8z^{-1} + 15z^{-2}\}U_2(z) + \quad [24]$ $$\{16z^{-1} + 5z^{-2}\}U_1(z)$$

For implementation, it is more efficient to reduce the computation explicitly by solving equations [23] and [24] simultaneously:

$$-\begin{vmatrix} \{11 - 7z^{-1}\} \\ \{9 - 5z^{-1}\} \end{vmatrix} \beta(z) =$$

$$\begin{vmatrix} \{16z^{-1} + 21z^{-2}\} & \{8 + 24z^{-1} + 7z^{-2}\} \\ \{-8 + 8z^{-1} + 15z^{-2}\} & \{16z^{-1} + 5z^{-2}\} \end{vmatrix} \begin{vmatrix} U_2(z) \\ U_1(z) \end{vmatrix}$$

so therefore:

$$\begin{vmatrix} U_2(z) \\ U_1(z) \end{vmatrix} = - \begin{vmatrix} \{11 - 7z^{-1}\} \\ \{9 - 5z^{-1}\} \end{vmatrix} \cdot$$

$$\begin{vmatrix} \{16z^{-1} + 21z^{-2}\} & \{8 + 24z^{-1} + 7z^{-2}\} \\ \{-8 + 8z^{-1} + 15z^{-2}\} & \{16z^{-1} + 5z^{-2}\} \end{vmatrix}^{-1} \beta(z)$$

To calculate the matrix inverse, first we calculate the determinant of the matrix Δ:

Δ={16z$^{-1}$+21z$^{-2}$}●{16z$^{-1}$+5z$^{-2}$}−{8+24z$^{-1}$+7z$^{-2}$}●{−8+8z$^{-1}$+15z$^{-2}$}

Δ={256z$^{-2}$+416z$^{-3}$+105z$^{-4}$}−{−64−128z$^{-1}$256z$^{-2}$416z$^{-3}$+105z$^{-4}$} so that: Δ=64{1+2z$^{-1}$}, and we calculate:

$$\begin{vmatrix} U_2(z) \\ U_1(z) \end{vmatrix} = \begin{vmatrix} \{11 - 7z^{-1}\} \\ \{9 - 5z^{-1}\} \end{vmatrix} \cdot \qquad [25]$$

$$\begin{vmatrix} \{16z^{-1} + 5z^{-2}\} & -\{8 + 24z^{-1} + 7z^{-2}\} \\ \{8 - 8z^{-1} - 15z^{-2}\} & \{16z^{-1} + 21z^{-2}\} \end{vmatrix} \cdot \frac{-\beta(z)}{64\{1 + 2z^{-1}\}}$$

$$\begin{vmatrix} U_2(z) \\ U_1(z) \end{vmatrix} =$$

$$\begin{vmatrix} \{11 - 7z^{-1}\} \cdot \{16z^{-1} + 5z^{-2}\} - \{9 - 5z^{-1}\} \cdot \{8 + 24z^{-1} + 7z^{-2}\} \\ \{11 - 7z^{-1}\} \cdot \{8 - 8z^{-1} - 15z^{-2}\} + \{9 - 5z^{-1}\} \cdot \{16z^{-1} + 21z^{-2}\} \end{vmatrix}$$

$$\frac{-\beta(z)}{64\{1 + 2z^{-1}\}}$$

$$\begin{vmatrix} U_2(z) \\ U_1(z) \end{vmatrix} =$$

$$\begin{vmatrix} \{176z^{-1} - 57z^{-2} - 35z^{-3}\} - \{176z^{-1} - 57z^{-2} - 35z^{-3}\} \\ \{88 - 144z^{-1} - 109z^{-2} + 105z - 3\} + \{144z^{-1} + 109z^{-2} - 105z^{-3}\} \end{vmatrix}$$

$$\frac{-\beta(z)}{64\{1 + 2z^{-1}\}}$$

$$\begin{vmatrix} U_2(z) \\ U_1(z) \end{vmatrix} = \begin{vmatrix} \frac{72}{64\{1 + 2z^{-1}\}} \\ \frac{-88}{64\{1 + 2z^{-1}\}} \end{vmatrix} \cdot \beta(z), \text{ and finally}$$

$$\begin{vmatrix} U_2(z) \\ U_1(z) \end{vmatrix} = \begin{vmatrix} \frac{9}{8\{1 + 2z^{-1}\}} \\ \frac{-11}{8\{1 + 2z^{-1}\}} \end{vmatrix} \cdot \beta(z)$$

Equation [23] can be expressed as a pair of control equations by solving for the two control variables $u_1$ and $u_2$ explicitly as a function of the input β and their own history to obtain:

$$\{1 + 2z^{-1}\} \cdot U_2(z) = \frac{9}{8} \beta(z), \qquad [26]$$

$$\{1 + 2z^{-1}\} \cdot U_1(z) = -\frac{11}{8} \beta(z); \text{ therefore:}$$

$$U_2(z) = \frac{9}{8} \beta(z) - 2z^{-1} \cdot U_2(z), \text{ and}$$

-continued $$U_1(z) = -\frac{11}{8} \beta(z) - 2z^{-1} \cdot U_1(z). \qquad [27]$$

To complete the design of the controller computation engine, each output is returned to the time domain:

$$u_1[nT_s] = -\frac{11}{8} \beta[nT_s] - 2u_1[(n-2)T_s], \qquad [28]$$

$$\text{and } u_2[nT_s] = \frac{9}{8} \beta[nT_s] - 2u_2[(n-2)T_s], \qquad [29]$$

and each is subjected to a different Zero-Order-Hold (ZOH) function which separates the two control signals into two half-cycle steps.

Figure 19:
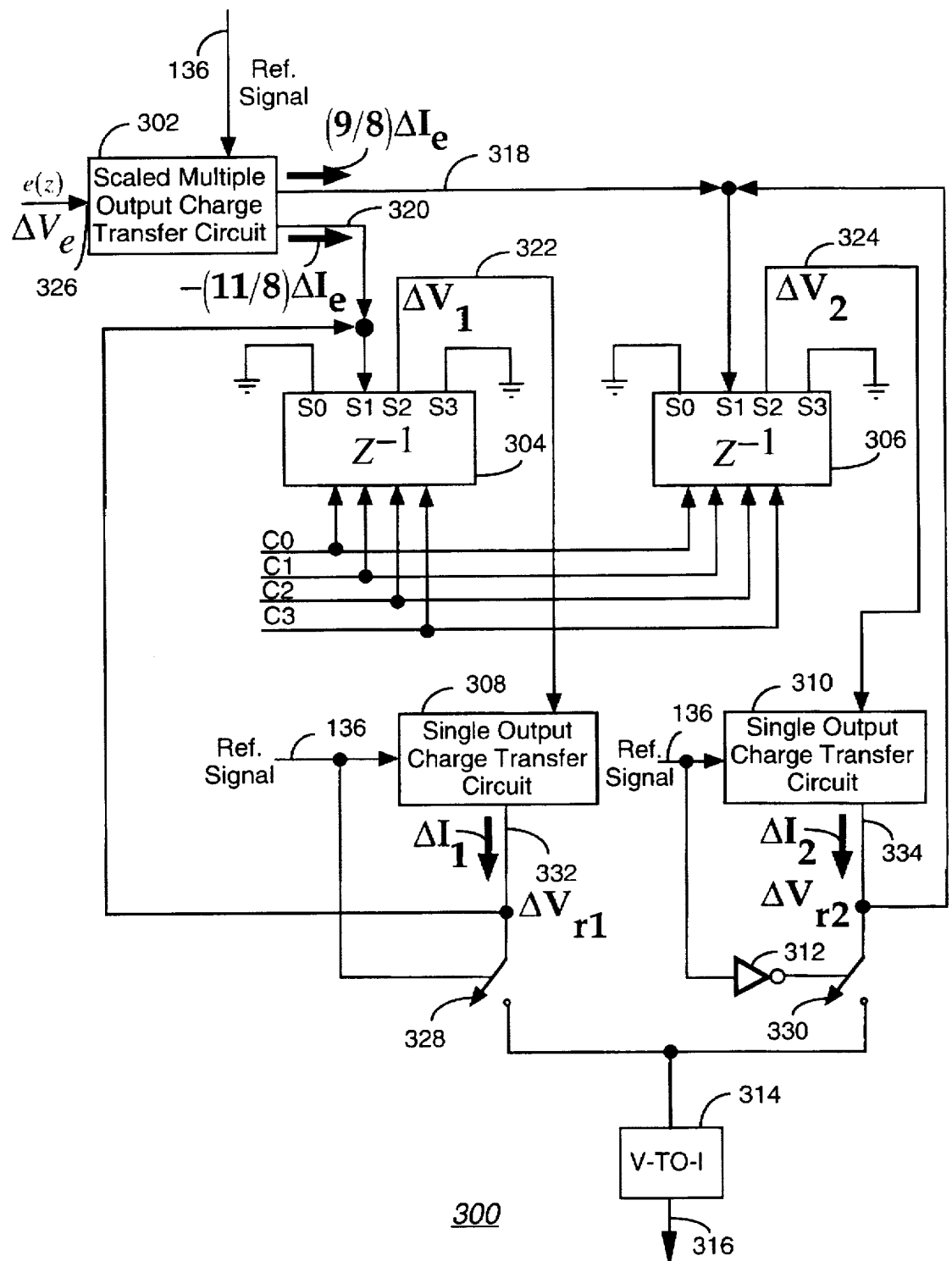
FIG. 19 is a detailed electrical block diagram of a modern control computing engine in accordance with the preferred embodiment of the present invention.

FIG. 19 is a detailed electrical block diagram of the modern control computing engine 300 in accordance with the preferred embodiment of the present invention. The computing engine 200 includes a scaled multiple output charge transfer circuit 302, two single clock delay $z^{-1}$ elements 304, 306 similar to the single clock delay $z^{-1}$ element 226, and two single output charge transfer circuits 308, 310. The charge transfer circuit 302 has the input node 326 for receiving the error signal e(z) in the form of a voltage change $\Delta V_e$, and a first output 318 coupled to the analog signal line S1 of the single clock delay element 306. The charge transfer circuit 302 also has a second output 320 coupled to the analog signal line S1 of the single clock delay element 304 for delivering thereto a charge proportional to the input voltage change $\Delta V_e$. The charge transfer circuit 308 has an input 322 coupled to the analog signal line S2 of the single clock delay element 304 for receiving therefrom an input voltage change $\Delta V_1$. The charge transfer circuit 308 also has an output 332 for providing a current pulse signal $\Delta I_1$ comprising a charge proportional to $\Delta V_1$. The output 332 is coupled to the analog signal line S1 of the single clock delay element 304 for coupling the current pulse signal $\Delta I_1$ thereto. The charge transfer circuit 310 has an input 324 coupled to the analog signal line S2 of the single clock delay element 306 for receiving therefrom an input voltage change $\Delta V_2$. The charge transfer circuit 310 also has an output 334 for providing a current pulse signal $\Delta I_2$ comprising a charge proportional to $\Delta V_2$. The output 334 is coupled to the analog signal line S1 of the single clock delay element 306 for coupling the current pulse signal $\Delta I_2$ thereto.

The modern control computing engine 300 also includes two conventional controlled switches 328, 330, an inverter 312, and a voltage-to-current (V-TO-I) converter 314. The two controlled switches are controlled by the reference signal 136, and the reference signal 136 after inversion by the inverter 312, such that the output 332 is coupled to the V-TO-I 314 during each positive half-cycle of the reference signal 136, and the output 334 is coupled to the V-TO-I converter 314 during each negative half-cycle of the reference signal 136. The V-TO-I converter 314 provides an output signal to the output node 316 of the modern control computing engine 300. As with the charge transfer circuits 224, 228, the reference signal 136 also is coupled to the charge transfer circuits 302, 308, 310 for clocking the charge transfer circuits 302, 308, 310.

The voltage signal $\Delta V_e$ is converted and scaled to two current pulses (9/8)$\Delta I_e$ and ▬(11/8)$\Delta I_e$ proportional to $\Delta V_e$. The current pulse ▬(11/8)$\Delta I_e$ is coupled to the single clock delay $z^{-1}$ element 304 which delays the generation of the equivalent voltage pulse $\Delta V_1$ by one clock cycle of the reference signal 136. The current pulse (9/8)$\Delta I_e$ is coupled to the single clock delay $z^{-1}$ element 306 which delays the generation of the equivalent voltage pulse $\Delta V_2$ by one clock cycle of the reference signal 136. To configure a discrete-time queuing element 218 as one of the single clock delay $z^{-1}$ elements 304, 306 the analog signal lines are connected such that S3 is connected to ground, S2 produces $\Delta V_1$ or $\Delta V_2$, S1 is connected to ■(11/8)$\Delta I_e$ or (9/8)$\Delta I_e$, and S0 is connected to ground.

Table 4 illustrates how the current pulse ■(11/8)$\Delta I_e$ is delayed by one clock cycle thereby generating the voltage pulse $\Delta V_1$.

TABLE 4

Signal Sequence for Single Clock Delay Element 304

| | CP3 | CP2 | CP1 | CP0 |
|---|---|---|---|---|
| C1 | ■(11/8)$\Delta I_e$ | $\Delta V_1$ | G | G |
| C2 | $\Delta V_1$ | G | G | ■(11/8)$\Delta I_e$ |
| C3 | G | G | ■(11/8)$\Delta I_e$ | $\Delta V_1$ |
| C0 | G | ■(11/8)$\Delta I_e$ | $\Delta V_1$ | G |
| C1 | ■(11/8)$\Delta I_e$ | $\Delta V_1$ | G | G |
| C2 | $\Delta V_1$ | G | G | ■(11/8)$\Delta I_e$ |

The highlighted sections of Table 4 illustrate the sequence of events which result in a single clock delayed output of the signal ■(11/8)$\Delta I_e$. For example, at C1 CP0 is reset (i.e., grounded). At C2, CP0 receives the pulse signal ■11/8)$\Delta I_e$ which is stored as a charge voltage $\Delta V_1$. One clock cycle later of the reference signal 136 when C3 is active, CP0 sources the output signal $\Delta V_1$. Note the same sequence rotates from CP0 through CP3.

The voltage pulse $\Delta V_1$ is coupled to the single output charge transfer circuit 308 which converts the pulse signal to an equivalent current pulse signal $-2\Delta I_1$. The current pulse signal $-2\Delta I_1$ is then combined simultaneously with the current pulse signal ■(11/8)$\Delta I_e$ at the S1 input of the single clock delay element 304 generating a resultant voltage pulse signal $\Delta V_{r1}$ at the output 332, conforming to equation [28]. The single clock delay element 306 and the charge transfer circuit 310 operate in a similar fashion to generate a resultant voltage pulse signal $\Delta V_{r2}$ at the output 334, conforming to equation [29]. The voltage pulse signals $\Delta V_{r1}$ and $\Delta V_{r2}$ are each converted to current signals by the conventional V-TO-I converter 314 representative of the output node 316 of the modern control computing engine 300. It will be appreciated that, alternatively, the single clock delay $z^{-1}$ elements 304, 306 can be implemented with a two-by-two version of the discrete-time analog queuing element 218 of FIG. 13 with two phase clocking.

Figure 20:
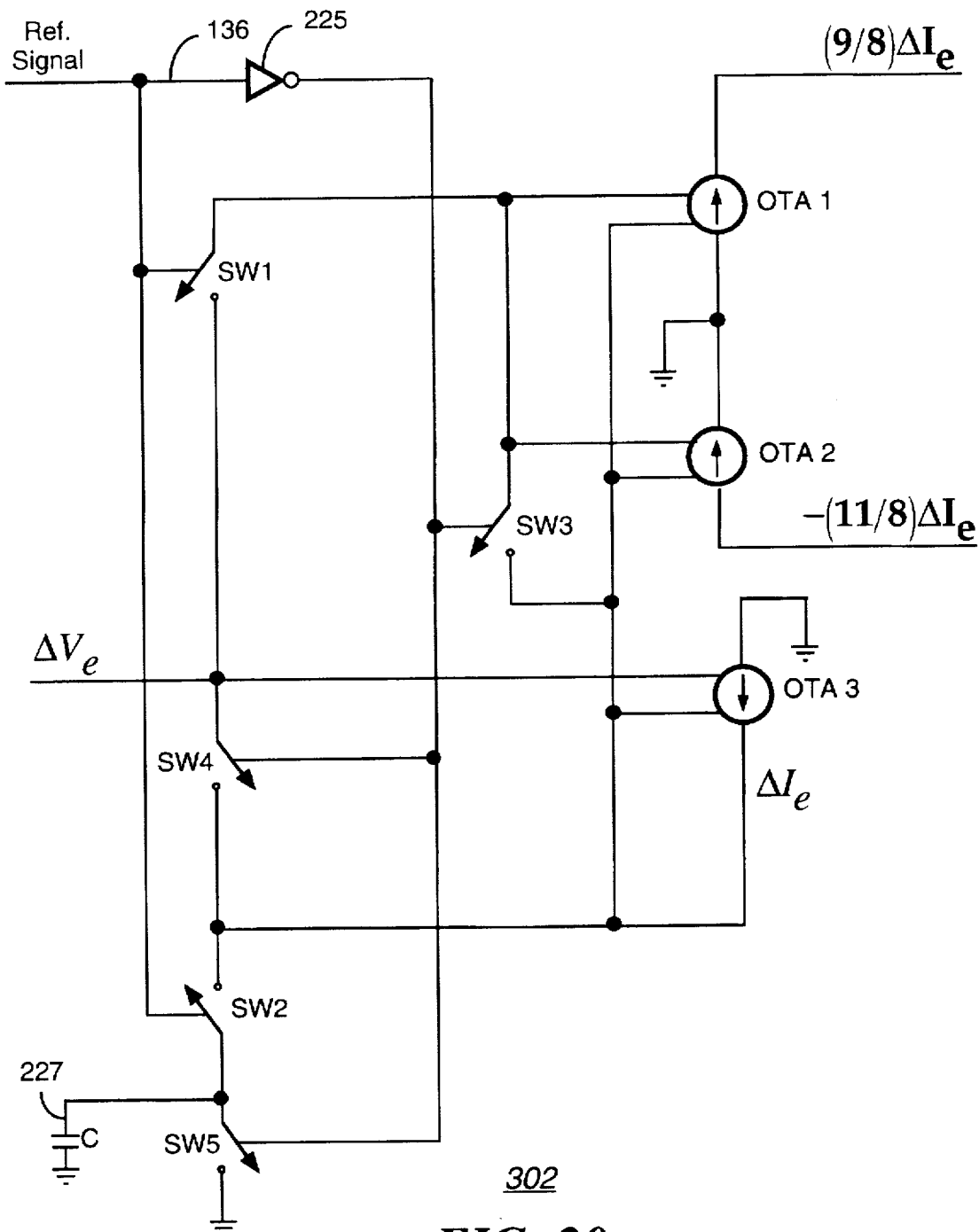
FIG. 20 is a detailed electrical block diagram of a scaled multiple output charge transfer circuit used with the modern control computing engine in accordance with the preferred embodiment of the present invention.

FIG. 20 is a detailed electrical block diagram of the scaled multiple output charge transfer circuit 302 used with the modern control computing engine 300 in accordance with the preferred embodiment of the present invention. The architecture and operation of the charge transfer circuit 302 are similar to those of the charge transfer circuit 224 (FIG. 17), the essential difference being that in the charge transfer circuit 302, OTA 1 and OTA 2 have been rescaled to generate the (9/8)$\Delta I_e$ and ■(11/8)$\Delta I_e$ current pulses required for the modern control computing engine 300.

Figure 21:
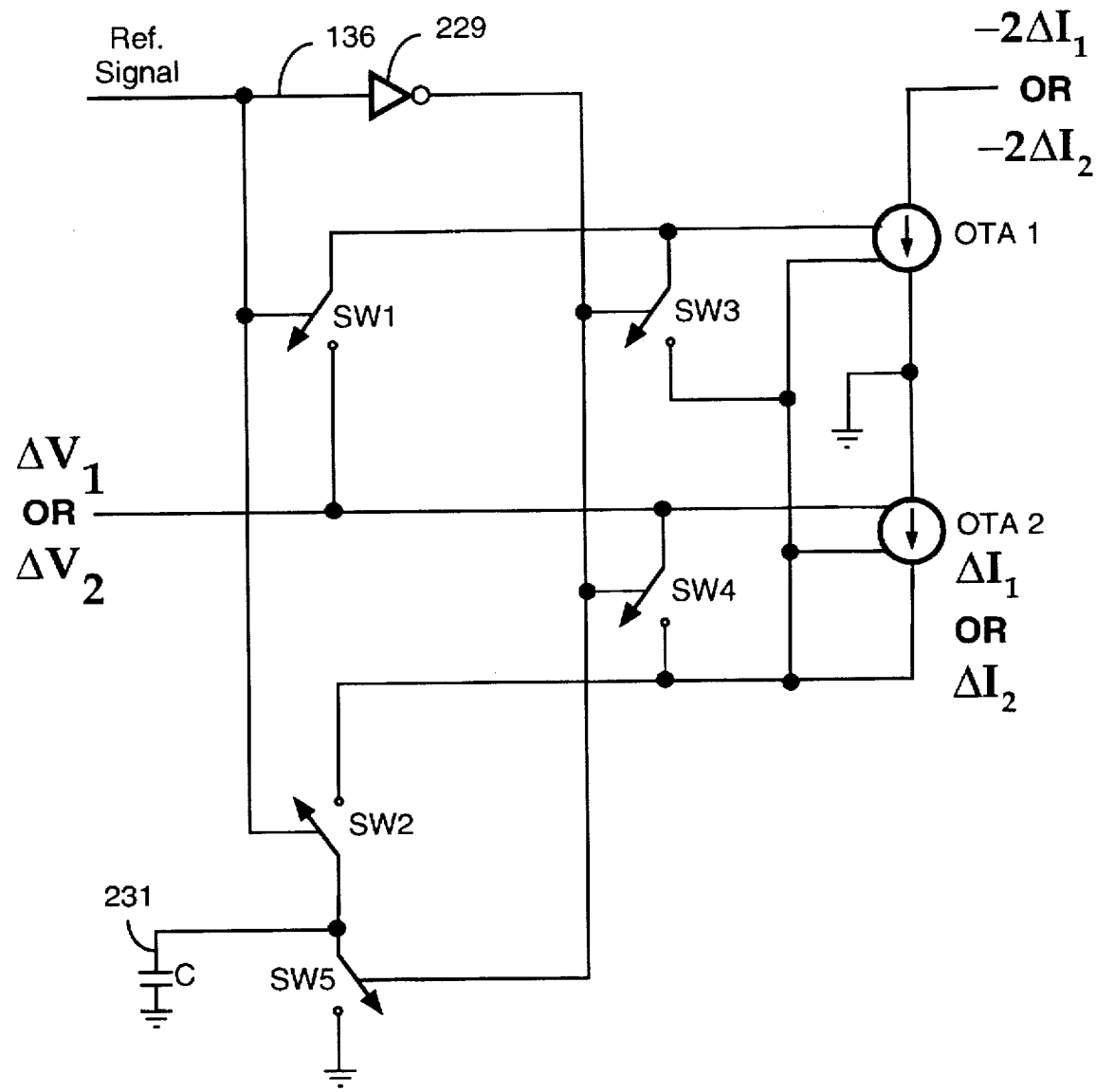
FIG. 21 is a detailed electrical block diagram of a single output charge transfer circuit used with the modern control computing engine in accordance with the preferred embodiment of the present invention.

FIG. 21 is a detailed electrical block diagram of each of the single output charge transfer circuits 308, 310 used with the modern control computing engine 300 in accordance with the preferred embodiment of the present invention. The architecture and operation of the charge transfer circuits 308, 310 are similar to those of the charge transfer circuit 228 (FIG. 18), the essential difference being that in the charge transfer circuits 308, 310, OTA 1 has been rescaled and redirected to generate the $-2\Delta I_1$ or $-2\Delta I_2$ current pulses required for the modern control computing engine 300.

Figure 22:
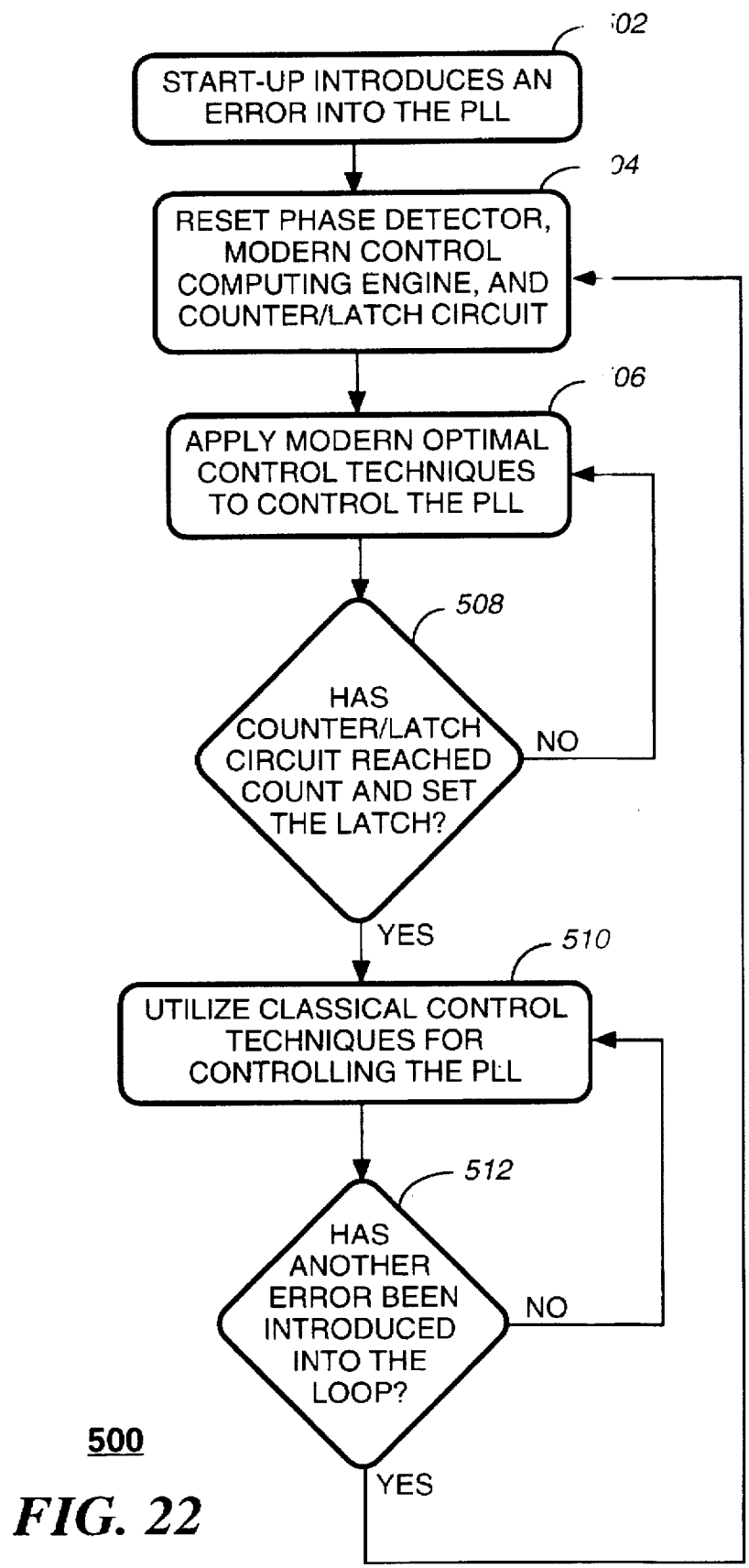
FIG. 22 is a flow chart depicting operation of the PLL of the synthesizer in accordance with the preferred embodiment of the present invention.

FIG. 22 is a flow chart depicting operation of the PLL of the synthesizer 143 in accordance with the preferred embodiment of the present invention. In step 502 a start-up of the synthesizer 143 introduces an error into the PLL. In response, the processor 126 resets the phase detector 202, the modern control computing engine 300, and the counter & latch circuit 260. The reset to the counter & latch circuit 260 closes the controlled switch 262 and opens the controlled switch 264, thereby connecting the modern control computing engine 300 into the PLL. In step 506 the modern control computing engine 300 applies modern optimal control techniques to control the PLL to quickly achieve phase and frequency lock. Step 508 tests whether the counter & latch circuit 260 has reached the predetermined count of the reference signal 136 for setting the latch. If not, the modern control assisted classical analog computing engine 222 continues to apply the modern control techniques to control the PLL. If, on the other hand, the counter & latch circuit 260 has reached the predetermined count and has set the latch, then the positions of the controlled switches 262, 264 will be reversed, thereby connecting the classical computing engine 200 into the PLL before the modern control computing engine has operated long enough to become unstable. From this point, in step 510 the classical computing engine 200 utilizes classical control techniques for controlling the PLL. If in step 512 the processor 126 determines that another error has been introduced into the loop, e.g., by changing the value of N in the divide by N frequency divider 214, then the flow returns to step 504 for the processor 126 to reset the circuitry and again apply modern control techniques for controlling the PLL to quickly regain phase and frequency lock.

Figure 23:
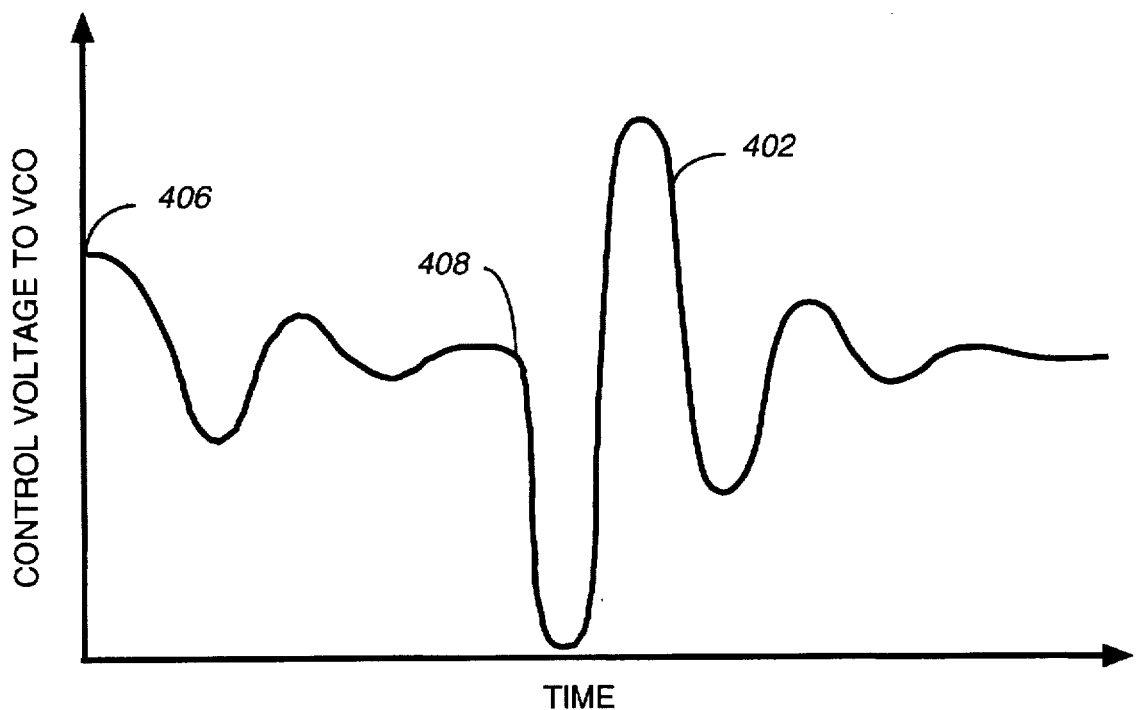
FIG. 23 and FIG. 24 illustrate simulations depicting the lock time performance of the phase-lock loop utilizing a classical computing engine only, and utilizing the modern control assisted classical computing engine.
Figure 24:
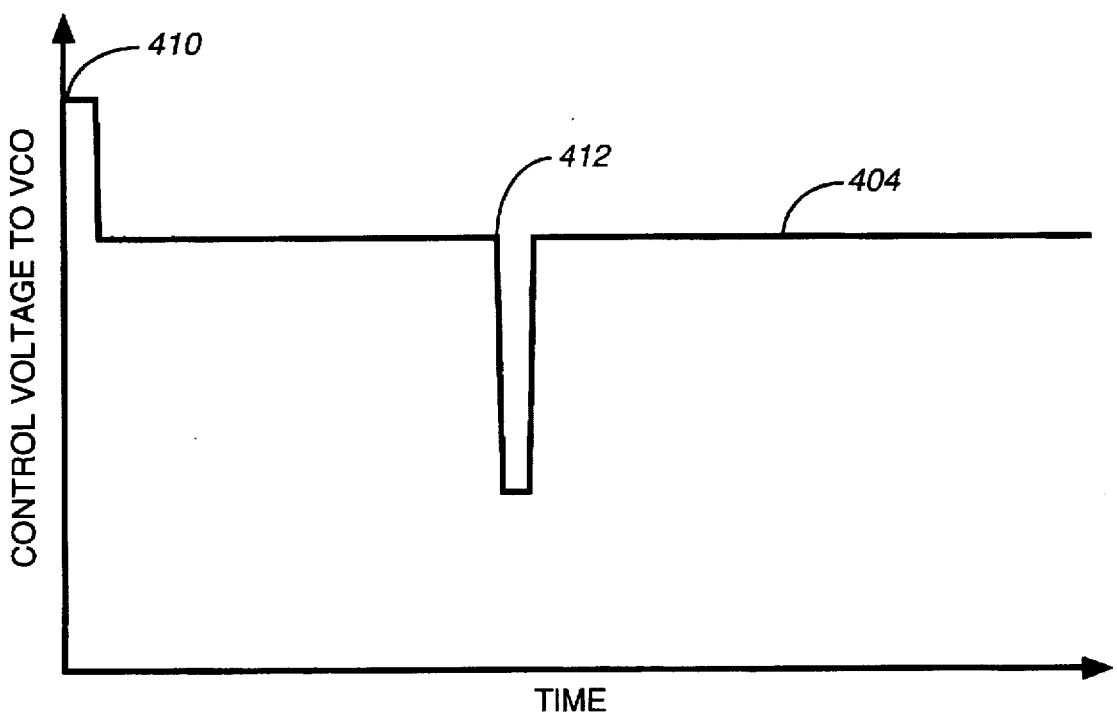

FIG. 23 illustrates simulations 400 depicting the lock time performance of a phase-lock loop utilizing a classical computing engine only, versus utilizing the modern control assisted classical computing engine 222 in accordance with the present invention. A graph 402 depicts on the vertical axis a control voltage provided to a voltage controlled oscillator (VCO) by a classical computing engine. A graph 404 depicts on the vertical axis the control voltage provided at the output of the integrator 210 of the synthesizer 143 in accordance with the present invention. The horizontal axis of each of the graphs 402, 404 corresponds to time.

Perturbations (e.g., a start-up or a change of a loop divider constant) are introduced at points 406, 408 in the graph 402. Note that the classical computing engine causes the VCO control voltage to oscillate for a substantial time after each of the perturbations. Similar perturbations are introduced at points 410, 412 in the graph 404. Note that the modern control assisted classical computing engine 222 in accordance with the present invention does not produce oscillations, but advantageously restores phase and frequency lock rapidly, e.g., within two cycles of the reference signal 136.

Such simulations have demonstrated that it is possible to obtain up to 22 times faster lock with the modern control assisted classical computing engine 222 than is possible utilizing a conventional classical computing engine. Faster PLL lock advantageously leads to a much longer time during which the power can be off in portable devices such as communication receivers which utilize battery saving techniques to prolong battery life.

One of ordinary skill in the art will appreciate that, while the synthesizer 143 in accordance with the present invention has been described as a component of the communication receiver 100, there are many other appropriate and useful applications. For example, the synthesizer 143 can be used as well to provide a reference frequency for exciting a transmitter and further employed as a clock generator for any device that utilizes a processor. In addition, it will be appreciated that the synthesizer 143 in accordance with the present invention can be used as well in many other communication applications where low-power, fast locking PLLs are desired. These and other applications that may occur to one of ordinary skill in the art do not depart from the scope and intent of the claimed instant invention.

Thus, it should be apparent by now that the present invention provides a method and apparatus for controlling a phase lock loop in a fast and efficient manner. The method and apparatus advantageously can control the phase lock loop such that a significant reduction in the lock time is achieved.

What is claimed is:

1. A method for controlling a phase lock loop, comprising the steps of:

measuring a current phase error of the signal at a current measurement time occurring at a periodic sampling rate;

determining, from the current phase error, control variables comprising first and second control values $u_1$ and $u_2$ for the current measurement time;

applying the first control value $u_1$ during a first time period after the current measurement time and applying the second control value $u_2$ during a second time period after the current measurement time; and utilizing classical control techniques for controlling the phase lock loop after the predetermined period.

2. The method of claim 1, wherein the determining step comprises the step of calculating a value for at least one of the control variables from a predetermined initialization value therefor, in response to an unavailability of an earlier value for the corresponding at least one of the control variables from an earlier measurement time.

3. The method of claim 1, wherein the determining step comprises the step of calculating a value for at least one of the control variables from an earlier value for the corresponding at least one of the control variables for an earlier measurement time, in response to an availability of the earlier value for the corresponding at least one of the control variables.

4. The method of claim 1, wherein the first and second time periods are each equal to $$T_s = \frac{1}{2 \times R}$$

where R is the periodic sampling rate, and
   wherein the first and second control values $u_1$ and $u_2$ are determined from:

$$u_1[nT_s] = -\frac{11}{8}\beta[nT_s] - 2u_1[(n-2)T_s]$$

$$u_2[nT_s] = \frac{9}{8}\beta[nT_s] - 2u_2[(n-2)T_s],$$

where $$\beta[nT_s] = \frac{2\epsilon(t)}{KT_s^2},$$

$\epsilon(t)$ being the current phase error, K being an open loop gain of the phase lock loop, and $u_j[(n-x)T_s]$ being a value of $u_j$ calculated for a measurement time x time periods $T_s$ before the current measurement time.

5. An apparatus for controlling a phase lock loop, the apparatus comprising:

means for applying modern optimal control techniques to control the phase lock loop for a predetermined period, in response to an error being introduced into a signal of the phase lock loop, the means for applying further comprising:

means for measuring a current phase error of the signal at a current measurement time occurring at a periodic sampling rate;

means, coupled to the means for measuring, for determining, from the current phase error, control variables comprising first and second control values $u_1$ and $u_2$ for the current measurement time; and means, coupled to the means for determining, for applying the first control value $u_1$ during a first time period after the current measurement time and for applying the second control value $u_2$ during a second time period after the current measurement time, and means, coupled to the means for applying, for utilizing classical control techniques for controlling the phase lock loop after the predetermined period.

6. The apparatus of claim 5, wherein the means for determining comprises means for calculating a value for at least one of the control variables from a predetermined initialization value therefor, in response to an unavailability of an earlier value for the corresponding at least one of the control variables from an earlier measurement time.

7. The apparatus of claim 5, wherein the means for determining comprises means for calculating a value for at least one of the control variables from an earlier value for the corresponding at least one of the control variables for an earlier measurement time, in response to an availability of the earlier value for the corresponding at least one of the control variables.

8. The apparatus of claim 5, wherein the first and second time periods are each equal to $$T_S = \frac{1}{2 \times R},$$

where R is the periodic sampling rate, and
   wherein the determining means is arranged to determine the first and second control values $u_1$ and $u_2$ from:

$$u_1[nT_S] = -\frac{11}{8}\beta[nT_S] - 2u_1[(n-2)T_S]$$

$$u_2[nT_S] = \frac{9}{8}\beta[nT_S] - 2u_2[(n-2)T_S],$$

where $$\beta[nT_S] = \frac{2\epsilon(t)}{KT_S^2},$$

$\epsilon(t)$ being the current phase error, K being an open loop gain of the phase lock loop, and $u_j[(n-x)T_s]$ being a value of $u_j$ calculated for a measurement time x time periods $T_s$ before the current measurement time.

9. A phase lock loop, comprising:

an integrator coupled to a computing element for integrating a control signal from the computing element;

a controlled oscillator coupled to the integrator for generating a controlled signal having a frequency;

a frequency divider coupled to the controlled oscillator for dividing the frequency of the controlled signal to produce a divided signal;

a phase error detector coupled to the divided signal and coupled to a reference signal for producing a phase error signal by comparing the reference signal and the divided signal, and the computing element coupled to the phase error detector for producing the control signal from the phase error signal, wherein the computing element is arranged to:
apply modern optimal control techniques to control the phase lock loop for a predetermined period, in response to an error being introduced between the divided signal and the reference signal; and
utilize classical control techniques for controlling the phase lock loop after the predetermined period.

10. The phase lock loop of claim 9, wherein at least a portion of the phase lock loop is manufactured as an integrated circuit comprising circuit elements selected from a group consisting of the integrator, the controlled oscillator, the frequency divider, the phase error detector, and the computing element.

11. The phase lock loop of claim 9, wherein the phase error detector is arranged to measure a current phase error between the reference signal and the divided signal at a current measurement time occurring at a periodic sampling rate, and wherein the computing element comprises a discrete-time computing element, and wherein, during at least one of applying the modern optimal control techniques and utilizing the classical control techniques, the computing element is further arranged to process the current phase error in the discrete-time computing element.

12. The phase lock loop of claim 9, wherein the phase error detector is arranged to measure a current phase error between the reference signal and the divided signal at a current measurement time occurring at a periodic sampling rate, and wherein the computing element is arranged to:
determine, from the current phase error, control variables comprising first and second control values $u_1$ and $u_2$ for the current measurement time; and
apply the first control value $u_1$ during a first time period after the current measurement time and apply the second control value $u_2$ during a second time period after the current measurement time.

13. The phase lock loop of claim 12, wherein to determine the control variables the computing element is arranged to calculate a value for at least one of the control variables from a predetermined initialization value therefor, in response to an unavailability of an earlier value for the corresponding at least one of the control variables from an earlier measurement time.

14. The phase lock loop of claim 12, wherein to determine the control variables the computing element is arranged to calculate a value for at least one of the control variables from an earlier value for the corresponding at least one of the control variables for an earlier measurement time, in response to an availability of the earlier value for the corresponding at least one of the control variables.

15. The phase lock loop of claim 12, wherein the first and second time periods are each equal to $$T_S - \frac{1}{2 \times R},$$

where R is the periodic sampling rate, and wherein the computing element is arranged to determine the first and second control values $u_1$ and $u_2$ from:

$$u_1[nT_S] = -\frac{11}{8} \beta[nT_S] - 2u_1[(n-2)T_S]$$

$$u_2[nT_S] = \frac{9}{8} \beta[nT_S] - 2u_2[(n-2)T_S],$$

where $$\beta[nT_S] = \frac{2\epsilon(t)}{KT_S^2},$$

$\epsilon(t)$ being the current phase error, K being an open loop gain of the phase lock loop, and $u_j[(n-x)T_s]$ being a value of $u_j$ calculated for a measurement time x time periods $T_s$ before the current measurement time.

\* \* \* \* \*

UNITED STATES PATENT AND TRADEMARK OFFICE
CERTIFICATE OF CORRECTION

PATENT NO. : 5,754,598
DATED : May 19, 1998
INVENTOR(S) : Barrett et al.

It is certified that error appears in the above-indentified patent and that said Letters Patent is hereby corrected as shown below:

Column 26, line 32, change "-" to --=--.

Signed and Sealed this

Eighteenth Day of August, 1998

Attest:

BRUCE LEHMAN

Attesting Officer

Commissioner of Patents and Trademarks